United States Patent
Yamazaki et al.

(10) Patent No.: US 8,421,069 B2
(45) Date of Patent: Apr. 16, 2013

(54) SEMICONDUCTOR DEVICE

(75) Inventors: Shunpei Yamazaki, Tokyo (JP); Jun Koyama, Kanagawa (JP); Hiroyuki Miyake, Kanagawa (JP); Kei Takahashi, Kanagawa (JP); Kouhei Toyotaka, Kanagawa (JP); Masashi Tsubuku, Kanagawa (JP); Kosei Noda, Kanagawa (JP); Hideaki Kuwabara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 55 days.

(21) Appl. No.: 12/904,579

(22) Filed: Oct. 14, 2010

(65) Prior Publication Data

US 2011/0101331 A1    May 5, 2011

(30) Foreign Application Priority Data

Oct. 30, 2009    (JP) ................ 2009-249815

(51) Int. Cl.
| | |
|---|---|
| H01L 29/10 | (2006.01) |
| H01L 29/12 | (2006.01) |
| H01L 29/04 | (2006.01) |
| H01L 31/00 | (2006.01) |
| H01L 27/15 | (2006.01) |
| H01L 29/26 | (2006.01) |
| H01L 31/12 | (2006.01) |
| H01L 33/00 | (2010.01) |

(52) U.S. Cl.
USPC ........... 257/43; 257/52; 257/79; 257/E29.068

(58) Field of Classification Search .............. None
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

International Search Report, PCT Application No. PCT/JP2010/067998, dated Dec. 28, 2010, 3 pages.

(Continued)

*Primary Examiner* — Fernando L Toledo
*Assistant Examiner* — Valerie N Newton
(74) *Attorney, Agent, or Firm* — Fish & Richardson P.C.

(57) ABSTRACT

An object is to reduce leakage current and parasitic capacitance of a transistor used for an LSI, a CPU, or a memory. A semiconductor integrated circuit included in an LSI, a CPU, or a memory is manufactured using the transistor which is formed using an oxide semiconductor which is an intrinsic or substantially intrinsic semiconductor obtained by removal of impurities which serve as electron donors (donors) from the oxide semiconductor and has larger energy gap than a silicon semiconductor, and is formed over a semiconductor substrate. With the transistor which is formed over the semiconductor substrate and includes the highly purified oxide semiconductor layer with sufficiently reduced hydrogen concentration, a semiconductor device whose power consumption due to leakage current is low can be realized.

16 Claims, 19 Drawing Sheets

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0228389 A1* | 10/2007 | Hsu et al. | 257/79 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0045397 A1* | 2/2009 | Iwasaki | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0084651 A1 | 4/2010 | Yamazaki et al. | |
| 2010/0085081 A1 | 4/2010 | Ofuji et al. | |
| 2010/0092800 A1 | 4/2010 | Itagaki et al. | |
| 2010/0109002 A1 | 5/2010 | Itagaki et al. | |
| 2010/0193785 A1 | 8/2010 | Kimura | |
| 2010/0244029 A1* | 9/2010 | Yamazaki et al. | 257/52 |
| 2010/0276689 A1 | 11/2010 | Iwasaki | |
| 2010/0279462 A1 | 11/2010 | Iwasaki | |
| 2011/0089414 A1 | 4/2011 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-171775 A | 7/1991 |
| JP | 05-251705 A | 9/1993 |
| JP | 08-264794 A | 10/1996 |
| JP | 10-319869 A | 12/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2007-103918 A | 4/2007 |
| JP | 2007-273956 A | 10/2007 |
| JP | 2009-004733 A | 1/2009 |
| JP | 2009-033145 A | 2/2009 |
| WO | 2004/114391 A1 | 12/2004 |
| WO | 2007/029844 A1 | 3/2007 |
| WO | 2008/143304 A1 | 11/2008 |

OTHER PUBLICATIONS

Written Opinion, PCT Application No. PCT/JP2010/067998, dated Dec. 28, 2010, 5 pages.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous IN-GA-ZN-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous IN-GA-ZN-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous IN-GA-ZN-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous IN-GA-ZN-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using IN-GA-ZN-Oxide TFTS With a Novel Passivation Layer," SID Digest '09 : SID International Symposium Digest of Technical Papers, May 31, 2009, pp. 284-287.

* cited by examiner

SEMICONDUCTOR DEVICE

TECHNICAL FIELD

The present invention relates to a semiconductor device including an integrated circuit which includes a transistor and a manufacturing method thereof. For example, the present invention relates to an electronic device having a semiconductor integrated circuit as a component.

In this specification, a "semiconductor device" refers to any device which can function by utilizing semiconductor characteristics; an electro-optical device, a semiconductor circuit, an electronic component, and an electronic device are all included in the category of the semiconductor device.

BACKGROUND ART

In recent years, semiconductor devices have been developed to be used as an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) such as an LSI, a CPU, or a memory is mounted on a circuit board, for example, a printed wiring board, to be used as one of components of a variety of electronic devices.

Further, a semiconductor device capable of transmitting and receiving data has been developed; such a semiconductor device is called a wireless tag, an RFID tag, or the like. Those put into practical use include a semiconductor circuit (IC chip) formed using an antenna and a semiconductor substrate in many cases.

A silicon-based semiconductor material has been known as a semiconductor material which can be applied to a transistor; however, an oxide semiconductor has attracted attention as another material. As a material of the oxide semiconductor, zinc oxide and a material including zinc oxide as its component are known. In addition, a thin film transistor including an amorphous oxide (oxide semiconductor) whose electron carrier concentration is lower than $10^{18}$/cm$^3$ is disclosed (Patent Documents 1 to 3).

REFERENCE

Patent Document 1: Japanese Published Patent Application No. 2006-165527
Patent Document 2: Japanese Published Patent Application No. 2006-165528
Patent Document 3: Japanese Published Patent Application No. 2006-165529

DISCLOSURE OF INVENTION

Power consumption of electronic devices in a standby period is regarded as important as well as power consumption in an operating period. Specifically, as for portable electronic devices, to which power is supplied from battery, time of use is limited due to limited amount of electric power. Further, as for in-vehicle electronic devices, when leakage current in a standby period is large, lifetime of battery may be reduced. In the case of an electric vehicle, leakage current of the in-vehicle electronic device shortens the traveling distance per a certain amount of charging.

In order to reduce power consumption, reducing leakage current in a standby period as well as power consumption in an operating period is effective. Although the amount of leakage current of each transistor is not large, several millions of transistors are provided in an LSI, and the total amount of leakage current of those transistors is by no means small. Such leakage current causes an increase in power consumption of the semiconductor device in a standby period. Although leakage current is caused by various factors, electric power can be saved in a driver circuit or the like which is used in electronic devices, by reducing leakage current in a standby period.

Therefore, an object of the present invention is to reduce leakage current of a transistor used for an LSI, a CPU, or a memory.

Reduction in parasitic capacitance is also effective for reduction in power consumption in an operating period; therefore, another object of the present invention is to reduce power consumption by reducing parasitic capacitance.

In addition, another object of the present invention is to shorten the channel length L of a transistor used in a semiconductor integrated circuit which is included in an LSI, a CPU, or a memory, so that operation speed of the circuit is increased, and further, power consumption is reduced.

A semiconductor integrated circuit included in an LSI, a CPU, or a memory is manufactured using a transistor which is formed using an oxide semiconductor which is an intrinsic or substantially intrinsic semiconductor obtained by removal of impurities which serve as electron donors (donors) from the oxide semiconductor and has larger energy gap than a silicon semiconductor, and is formed over a semiconductor substrate.

A highly purified oxide semiconductor layer in which impurities such as hydrogen or a hydroxyl group contained in the oxide semiconductor are removed so that the hydrogen concentration is lower than or equal to $5 \times 10^{19}$ atoms/cm$^3$, preferably lower than or equal to $5 \times 10^{18}$ atoms/cm$^3$, far preferably lower than or equal to $5 \times 10^{17}$ atoms/cm$^3$, is used for a transistor, whereby an off-current of the transistor is reduced. The concentration of hydrogen in the oxide semiconductor layer is measured by secondary ion mass spectrometry (SIMS).

It is preferable that when a gate voltage Vg is positive, a drain current Id be sufficiently large, and when the gate voltage Vg is less than or equal to zero, the drain current Id be zero. In the transistor including the highly purified oxide semiconductor layer with sufficiently reduced hydrogen concentration, in the case where a drain voltage Vd is +1 V or +10 V, the off-current value can be smaller than $1 \times 10^{-13}$ A where the gate voltage Vg is in the range of −5 V to −20 V.

By using the transistor which is formed over the semiconductor substrate and includes the highly purified oxide semiconductor layer with sufficiently reduced hydrogen concentration, a semiconductor device whose power consumption due to leakage current is low can be realized.

When a semiconductor substrate is used as the substrate used for forming the transistor which includes the highly purified oxide semiconductor layer with sufficiently reduced hydrogen concentration, static electricity can be shielded, so that the effect of the static electricity on the transistor can be decreased as compared to the case of using an insulating substrate. Further, the semiconductor substrate, which has high heat conductivity, is preferably used to release heat of a semiconductor circuit. Further, the semiconductor substrate can be functioned as a back gate, so that generation of a parasitic channel can be suppressed.

One structure in accordance with the present invention is a semiconductor device provided with a semiconductor integrated circuit including a plurality of transistors including: an insulating film over a semiconductor substrate; an oxide semiconductor layer whose hydrogen concentration measured by secondary ion mass spectrometry is lower than or equal to $5\times10^{19}$ atoms/cm$^3$ and carrier concentration is lower than or equal to $5\times10^{14}$/cm$^3$ over the insulating film; a source and drain electrode layers over the oxide semiconductor layer; a gate insulating layer over the oxide semiconductor layer and the source and drain electrode layers; and a gate electrode layer over the gate insulating layer.

With the above structure, at least one of the above problems can be resolved.

In addition, a conductive layer may be formed below the oxide semiconductor layer. Another structure in accordance with the present invention is a semiconductor device including a plurality of transistors including: an insulating film over a semiconductor substrate; a conductive layer over the insulating film; an insulating layer over the conductive layer; an oxide semiconductor layer whose hydrogen concentration measured by secondary ion mass spectrometry is lower than or equal to $5\times10^{19}$ atoms/cm$^3$ and carrier concentration is lower than or equal to $5\times10^{14}$/cm$^3$ over the insulating layer; a source and drain electrode layers over the oxide semiconductor layer; a gate insulating layer over the oxide semiconductor layer and the source and drain electrode layers; and a gate electrode layer over the gate insulating layer. The conductive layer overlaps with the oxide semiconductor layer with the insulating layer provided therebetween.

In each of the above structures, it is preferable that the insulating film over the semiconductor substrate be a thermally-oxidized film. By forming the thermally-oxidized film by thermal oxidation, a dense and high-quality film can be formed.

Further, in each of the above structures, it is preferable that in order to reduce the parasitic capacitance, an insulating layer be further provided on and in contact with the source electrode layer or the drain electrode layer, and the source electrode layer or the drain electrode layer overlap with part of the gate electrode layer with the gate insulating layer and the insulating layer provided therebetween. By providing the insulating layer on and in contact with the source electrode layer or the drain electrode layer, parasitic capacitance between the gate electrode layer and the source electrode layer or parasitic capacitance between the gate electrode layer and the drain electrode layer can be decreased.

Further, in a wiring intersection portion, in order to reduce the parasitic capacitance, the gate insulating layer and the insulating layer are stacked between a gate wiring layer and a source wiring layer. By increasing the distance between the gate wiring layer and the source wiring layer, power consumption due to parasitic capacitance can be reduced and short-circuiting between wirings can be prevented.

Further, an EDMOS circuit can be formed by combining a plurality of transistors formed over a semiconductor substrate, including an oxide semiconductor layer with sufficiently reduced hydrogen concentration. Such an EDMOS circuit includes a first transistor including a first oxide semiconductor layer and a second transistor including a second oxide semiconductor layer over the semiconductor substrate, wherein the hydrogen concentrations of the first oxide semiconductor layer and the second semiconductor layer measured by secondary ion mass spectrometry are lower than or equal to $5\times10^{19}$ atoms/cm$^3$ and the carrier concentrations thereof are lower than or equal to $5\times10^{14}$/cm$^3$.

A resistor, a capacitor, an inductor, and the like can be formed over the same substrate by using the oxide semiconductor layer with sufficiently reduced hydrogen concentration. For example, the resistor can be formed by sandwiching the oxide semiconductor layer with sufficiently reduced hydrogen concentration by upper and lower electrode layers. In each of the above structures, an oxide semiconductor layer which serves as a resistor is provided over the same substrate, between a first conductive layer and a second conductive layer which overlaps with the first conductive layer.

As well as an LSI, a CPU, or a memory, the transistor including the oxide semiconductor layer with sufficiently reduced hydrogen concentration can be used for a power supply circuit, a transmitting and receiving circuit, an amplifier of an audio processing circuit, a driver circuit of a display portion, a controller, a converter of an audio processing circuit, or the like.

A plurality of semiconductor integrated circuits can be mounted on one package to increase the density of a semiconductor device, which is a so-called MCP (Multi Chip Package).

Further, in the case where the semiconductor integrated circuit is mounted on a circuit board, the semiconductor integrated circuit may be mounted in a face-up state or a flip-chip state (face-down state).

With a transistor which is provided over a semiconductor substrate and includes an oxide semiconductor layer with sufficiently reduced hydrogen concentration, generation of a parasitic channel can be suppressed, leakage current can be extremely suppressed, and parasitic capacitance can be reduced. A semiconductor device with low power consumption can be realized by using the transistor in a semiconductor integrated circuit.

BEST MODE FOR CARRYING OUT THE INVENTION

Figure 1:
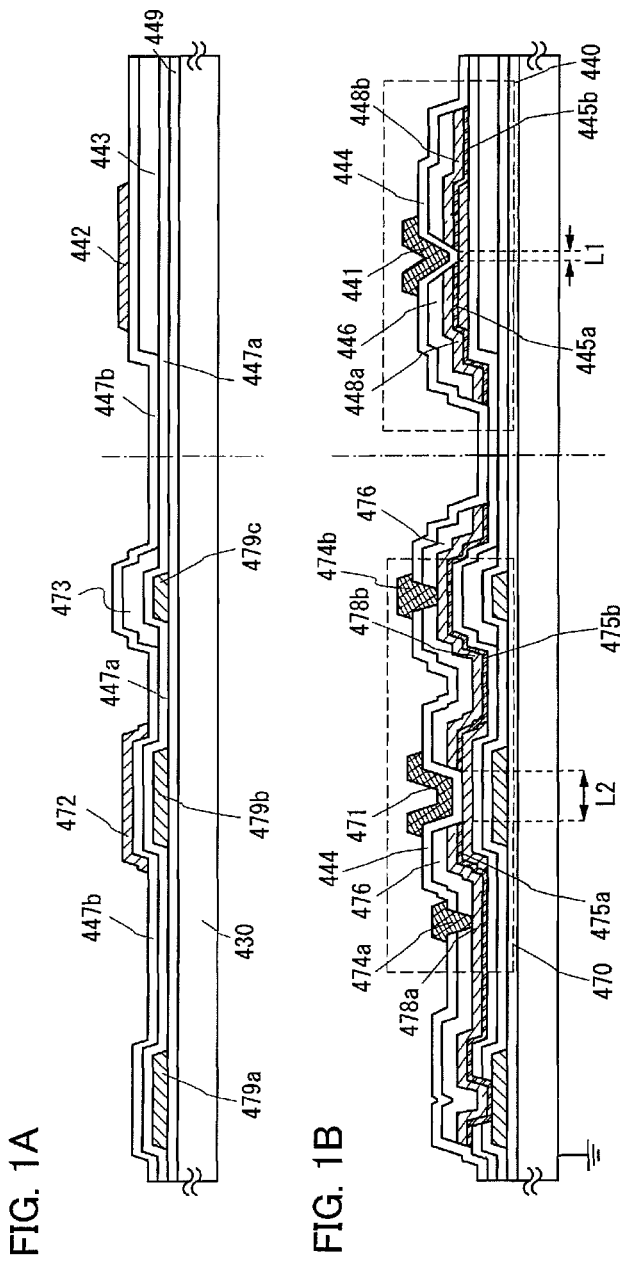
FIGS. 1A and 1B are cross-sectional views illustrating one embodiment of the present invention.

Hereinafter, embodiments of the present invention will be described with reference to the accompanying drawings. However, it is easily understood by those skilled in the art that modes and details disclosed herein can be modified in various ways without departing from the spirit and scope of the present invention. Therefore, the present invention is not construed as being limited to description of the embodiments.

Embodiment 1

In Embodiment 1, an example of a cross-sectional structure of a semiconductor integrated circuit will be described.

One embodiments of a semiconductor integrated circuit of the present invention and a manufacturing method thereof will be described with reference to FIGS. 1A and 1B, FIG. 2, FIG. 3, and FIGS. 4A and 4B.

FIGS. 1A and 1B illustrate an example of a cross-sectional structure of a semiconductor device. A transistor 440 illustrated in FIG. 1B is a top-gate transistor.

The transistor 440 includes over a semiconductor substrate 430, an insulating film 449, a first insulating layer 447a, a second insulating layer 443, a third insulating layer 447b, an oxide semiconductor layer 442, a first source electrode layer 445a, a second source electrode layer 448a, a first drain electrode layer 445b, a second drain electrode layer 448b, a fourth insulating layer 446, a gate insulating layer 444, and a gate electrode layer 441.

Part of the oxide semiconductor layer 442 which overlaps with the gate electrode layer 441 is a channel formation region, and a channel length L1 is determined by the distance between the lower edge portion of the first source electrode layer 445a and the lower edge portion of the first drain electrode layer 445b which are next to each other over the oxide semiconductor layer 442.

Although the transistor 440 is described using a single-gate transistor, a multi-gate transistor including a plurality of channel formation regions can be formed as necessary.

Hereinafter, a process for manufacturing the transistor 410 and a transistor 470 over the semiconductor substrate 430 is described with reference to FIG. 1A.

As a material used for the semiconductor substrate 430, a polycrystalline silicon, a microcrystalline silicon, or a single-crystalline silicon to which an impurity element such as boron or phosphorus is doped can be used. Silicon carbide (SiC) may be used.

The semiconductor substrate 430 can be functioned as a back gate. The potential of the back gate can be a fixed potential, e.g., 0 V, or a ground potential, and may be determined as appropriate. With the structure in which the semiconductor substrate functions as a back gate, the electrical field of the outside can be blocked and an adverse effect of the external electrical field on a semiconductor device can be suppressed. Accordingly, generation of a parasitic channel due to accumulation of electric charge on the substrate side of the oxide semiconductor layer and fluctuation in the threshold voltage can be prevented.

In addition, by providing the gate electrodes above and below the oxide semiconductor layer, in a bias-temperature stress test (hereinafter, referred to as a BT test) for examining reliability of the transistor, the amount of shift in threshold voltage of the transistor by the BT test can be reduced. That is, by providing the gate electrodes above and below the oxide semiconductor layer, the reliability can be improved.

By using the semiconductor substrate as the substrate over which a transistor including a highly purified oxide semiconductor layer with sufficiently reduced hydrogen concentration is formed, the static electricity can be blocked, so that an adverse effect of the static electricity on the transistor can be reduced as compared to the case where an insulating substrate is used. Specifically, the amount of carries induced by the static electricity can be decreased.

First, an insulating film 449 is formed over the semiconductor substrate 430. For example, the insulating film 449 can be formed to have a single-layer structure or a stacked-layer structure of a silicon oxide layer, a silicon nitride layer, a silicon oxynitride layer, and/or a silicon nitride oxide layer by a plasma CVD method, a sputtering method, or the like.

First, a conductive film is formed over the insulating film 449, and after that, electrode layers 479a, 479b, and 479c are formed by a first photolithography step. The electrode layers 479a, 479b, and 479c can be formed using an element selected from Al, Cr, Cu, Ta, Ti, Mo, and W, an alloy containing any of these elements, an alloy containing a combination of any of these elements, or the like. In this embodiment, the electrode layers 479a, 479b, and 479c each have a stacked-layer structure of a tungsten nitride layer and a tungsten layer.

Next, the first insulating layer 447a is formed to cover the electrode layers 479a, 479b and 479c. The first insulating layer 447a can be formed to have a single-layer structure or a stacked-layer structure of a silicon oxide layer, a silicon nitride layer, a silicon oxynitride layer, and/or a silicon nitride oxide layer by a plasma CVD method, a sputtering method, or the like.

Next, a spacer insulating layer is formed over the first insulating layer 447a, and is selectively removed by a second photolithography step, so that the second insulating layer 443 is formed. The spacer insulating layer is formed to have a single-layer structure or a stacked-layer structure of a silicon oxide layer, a silicon nitride layer, a silicon oxynitride layer, and/or a silicon nitride oxide layer by a plasma CVD method, a sputtering method, or the like. The thickness of the spacer insulating layer is greater than or equal to 500 nm and less than or equal to 2 μm. By the same step, a fifth insulating layer 473 functioning as a spacer insulating layer is formed so as to overlap with the electrode layer 479c. In this manner, a stacked layer region with large thickness and a single layer region with small thickness are formed. In order to reduce parasitic capacitance, the fifth insulating layer functioning as a spacer insulating layer and the first insulating layer are stacked in the region with large thickness, and in order to form a storage capacitor and the like, the first insulating layer is provided in the region with small thickness.

Next, the third insulating layer 447b is formed to cover the electrode layers 479a, 479b, and 479c. The third insulating layer 447b which is in contact with the oxide semiconductor layer is preferably formed using an oxide insulating layer such as a silicon oxide layer, a silicon oxynitride layer, an aluminum oxide layer, or an aluminum oxynitride layer. As a method for forming the third insulating layer 447b, a plasma CVD method, a sputtering method, or the like can be used; it is preferable that the third insulating layer 447b be formed by a sputtering method in order not to contain a large amount of hydrogen in the third insulating layer 447b.

In this embodiment, a silicon oxide layer is formed as the third insulating layer 447b by a sputtering method. The semiconductor substrate 430 is transferred to a treatment chamber, a sputtering gas including highly purified oxygen from which hydrogen and moisture are removed is introduced therein, and a target of silicon is used, whereby a silicon oxide layer is formed over the semiconductor substrate 430 as the third insulating layer 447b. The semiconductor substrate 430 may have room temperature, or may be heated.

For example, a silicon oxide layer is formed by an RF sputtering method under the following condition: quartz (preferably, synthetic quartz) is used; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen is 25 sccm, and the flow ratio of argon is 25 sccm). The thickness of the film is 100 nm. Instead of quartz (preferably, synthetic quartz), a silicon target can be used as a target used when the silicon oxide layer is formed. As a sputtering gas, oxygen or a mixed gas of oxygen and argon is used.

In that case, it is preferable that the third insulating layer 447b be formed while moisture remaining in the treatment chamber is removed. This is so that the third insulating layer 447b does not contain hydrogen, hydroxyl, or moisture.

In order to remove residual moisture from the treatment chamber, an adsorption-type vacuum pump is preferably used. For example, a cryopump, an ion pump, or a titanium sublimation pump is preferably used. As an evacuation unit, a turbo pump provided with a cold trap may be used. In a treatment chamber which is evacuated using a cryopump, for example, hydrogen atoms, compounds including hydrogen atoms such as water ($H_2O$), or the like are exhausted; thus, the concentration of impurities contained in the third insulating layer 447b which is deposited in the deposition chamber can be reduced.

Examples of the sputtering method include an RF sputtering method in which a high-frequency power source is used for a sputtering power supply, a DC sputtering method in which a DC power source is used, and a pulsed DC sputtering method in which a bias is applied in a pulsed manner. The RF sputtering method is mainly used in the case where an insulating film is formed, and the DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber, which is for a magnetron sputtering method, and a sputtering apparatus which is used for an ECR sputtering method in which plasma produced with the use of microwaves is used without using glow discharge.

Further, as a deposition method using the sputtering method, a reactive sputtering method in which a target substance and a sputtering gas component are chemically reacted with each other during deposition to form a thin compound film thereof, or a bias sputtering method in which a voltage is also applied to a substrate during deposition can be used.

The third insulating layer 447b may have a stacked-layer structure. For example, a nitride insulating layer such as a silicon nitride layer, a silicon nitride oxide layer, or an aluminum nitride layer, and the above-described oxide insulating layer may be stacked over the semiconductor substrate 430.

For example, a sputtering gas including highly purified nitrogen from which hydrogen and moisture are removed is introduced between the silicon oxide layer and the substrate to form a silicon nitride layer with the use of a silicon target. Also in that case, it is preferable that the silicon nitride layer be formed while moisture remaining in the treatment chamber is removed, in a manner similar to that of the silicon oxide layer.

Also in the case of forming the silicon nitride layer, the substrate may be heated at the time of the deposition.

In the case where the silicon nitride layer and the silicon oxide layer are stacked as the third insulating layer 447b, the silicon nitride layer and the silicon oxide layer can be formed in one treatment chamber using the same silicon target. First, the silicon nitride layer is formed by introducing a sputtering gas including nitrogen and using a silicon target provided in the treatment chamber. Then, the sputtering gas is switched to a sputtering gas including oxygen, and the silicon oxide layer is formed using the same silicon target. The silicon nitride layer and the silicon oxide layer can be formed in succession without being exposed to air, thereby preventing impurities such as hydrogen or moisture from being adsorbed onto a surface of the silicon nitride layer.

Next, an oxide semiconductor film is formed to a thickness of greater than or equal to 2 nm and less than or equal to 200 nm over the third insulating layer 447b.

In order that hydrogen, hydroxyl, and moisture are contained as little as possible in the oxide semiconductor film, it is preferable that the semiconductor substrate 430 over which the third insulating layer 447b is formed be preheated in a preheating chamber of the sputtering apparatus, so that impurities such as hydrogen or moisture adsorbed on the semiconductor substrate 430 are discharged and exhausted, as a pretreatment before deposition. As an evacuation unit provided in the preheating chamber, a cryopump is preferable. Note that this preheating treatment can be omitted.

Before the oxide semiconductor film is formed by a sputtering method, dust on a surface of the third insulating layer 447b is preferably removed by reverse sputtering in which an argon gas is introduced and plasma is generated. The reverse sputtering is a method by which voltage is applied to a substrate side with a high-frequency power source in an argon atmosphere to generate plasma in the vicinity of the substrate without applying voltage to a target side, so that a surface is modified. Instead of the argon atmosphere, a nitrogen atmosphere, a helium atmosphere, an oxygen atmosphere, or the like may be used.

The oxide semiconductor film is formed by a sputtering method. Any of the following is used as the oxide semiconductor film: an In—Ga—Zn—O-based oxide semiconductor film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, and a Zn—O-based oxide semiconductor film. In this embodiment, the oxide semiconductor film is formed by a sputtering method with the use of a target for the deposition of an In—Ga—Zn—O-based oxide semiconductor film. Alternatively, the oxide semiconductor film can be formed by a sputtering method in a rare gas (typically, argon) atmosphere, an oxygen atmosphere, or a mixed atmosphere including a rare gas (typically, argon) and oxygen. In the case where a sputtering method is used, film deposition may be performed using a target containing $SiO_2$ at 2 to 10 wt % both inclusive.

As a target for forming the oxide semiconductor film by a sputtering method, a target of metal oxide which contains zinc oxide as its main component can be used. As another example of the target of metal oxide, a target for the deposition of an oxide semiconductor including In, Ga, and Zn (composition ratio is $In_2O_3:Ga_2O_3:ZnO=1:1:1$ [molar ratio]) can be used. As the target for the deposition of an oxide semiconductor including In, Ga, and Zn, a target having a composition ratio of $In_2O_3:Ga_2O_3:ZnO=1:1:2$ [molar ratio], or $In_2O_3:Ga_2O_3:ZnO=1:1:4$ [molar ratio] can be used as well. The filling rate of the target for the deposition of an oxide semiconductor is greater than or equal to 90% and less than or equal to 100%, preferably greater than or equal to 95% and less than or equal to 99.9%. With the use of the target for the deposition of an oxide semiconductor with a high filling rate, a dense oxide semiconductor film is formed.

The oxide semiconductor film is formed over the semiconductor substrate 430 in the following manner: the substrate is held in the treatment chamber which is kept in a reduced pressure state, a sputtering gas from which hydrogen and moisture are removed is introduced into the treatment chamber while removing moisture remaining therein, and metal oxide is used as a target. In order to remove residual moisture from the treatment chamber, an adsorption-type vacuum pump is preferably used. For example, a cryopump, an ion pump, or a titanium sublimation pump is preferably used. As an evacuation unit, a turbo pump provided with a cold trap may be used. In the case where the deposition chamber is evacuated with a cryopump, a hydrogen atom, a compound containing a hydrogen atom, such as water ($H_2O$), (more preferably, a compound containing a hydrogen atom and a carbon atom), and the like are removed, whereby the concentration of an impurity in the oxide semiconductor film formed in the deposition chamber can be reduced. The substrate may be heated when the oxide semiconductor film is deposited.

An example of the deposition condition is as follows: the substrate temperature is room temperature, the distance between the substrate and the target is 60 mm, the pressure is 0.4 Pa, the DC power is 0.5 kW, and the atmosphere is an atmosphere containing oxygen and argon (the flow ratio of oxygen to argon is 15 sccm:30 sccm). It is preferable that a pulsed direct-current (DC) power supply be used because powder substances (also referred to as particles or dust) at the time of film deposition can be reduced and the film thickness can be uniform. The thickness of the oxide semiconductor film is preferably greater than or equal to 5 nm and less than or equal to 30 nm. An appropriate thickness of the oxide semiconductor film varies depending on a material thereof; therefore, the thickness may be determined as appropriate depending on the material.

Next, the oxide semiconductor film is processed into the island-shaped oxide semiconductor layer 442 and an island-shaped oxide semiconductor layer 472 by a third photolithography step (see FIG. 1A). Further, a resist mask for forming the island-shaped oxide semiconductor layers 442 and 472 may be formed using an ink jet method. Formation of the resist mask by an inkjet method needs no photomask; thus, manufacturing costs can be reduced.

As the etching of the oxide semiconductor film here, either one or both of dry etching and wet etching may be performed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used.

As an etchant used for wet etching, a mixed solution of phosphoric acid, acetic acid, and nitric acid, or the like can be used. ITO07N (produced by KANTO CHEMICAL CO., INC.) may be used.

The etchant after the wet etching is removed together with the etched material by cleaning. The waste liquid including the etchant and the material etched off may be purified and the material may be reused. By collecting and reusing a material such as indium included in the oxide semiconductor layer from the waste liquid after the etching, the resources can be efficiently used and the costs can be reduced.

The etching conditions (such as an etchant, etching time, and temperature) are appropriately adjusted depending on a material so as to perform etching into a predetermined shape.

In this embodiment, the oxide semiconductor film is processed into the island-shaped oxide semiconductor layers 442 and 472 by a wet etching method using a mixed solution of phosphoric acid, acetic acid, and nitric acid as an etchant.

In this embodiment, a first heat treatment is performed on the oxide semiconductor layers 442 and 472. The temperature of the first heat treatment is higher than or equal to 400° C. and lower than or equal to 750° C., preferably higher than or equal to 400° C. and lower than the strain point of the substrate. In this embodiment, the substrate is introduced into an electric furnace which is one of heat treatment apparatuses, and heat treatment is performed for one hour at 450° C. on the oxide semiconductor layer in a nitrogen atmosphere. It is preferable that the heat treatment be followed by the next step without exposure to the air in order to prevent entry of water or hydrogen into the oxide semiconductor layer. By this first heat treatment, dehydration or dehydrogenation can be performed on the oxide semiconductor layers 442 and 472.

The heat treatment apparatus is not limited to the electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed, in which the substrate is moved into an inert gas heated to a high temperature as high as 650° C. to 700° C., heated for several minutes, and moved out of the inert gas heated to the high temperature. With GRTA, high-temperature heat treatment for a short period of time can be achieved.

Note that in the first heat treatment, it is preferable that water, hydrogen, and the like be not contained in the atmosphere of nitrogen or the rare gas such as helium, neon, or argon. It is preferable that the purity of nitrogen or the rare gas such as helium, neon, or argon which is introduced into the heat treatment apparatus be set to be 6N (99.9999%) or higher, far preferably 7N (99.99999%) or higher (that is, the impurity concentration is 1 ppm or lower, preferably 0.1 ppm or lower).

Further, depending on the condition of the first heat treatment or a material of the oxide semiconductor layer, the oxide semiconductor layer may be crystallized to be a microcrystalline film or a polycrystalline film. For example, the oxide semiconductor layer may be crystallized to be a microcrystalline semiconductor layer having a degree of crystallization of 90% or more, or 80% or more. Further, depending on the condition of the first heat treatment or a material of the oxide semiconductor layer, the oxide semiconductor layer may become an amorphous oxide semiconductor layer containing no crystalline component. Alternatively, the oxide semiconductor layer may become an oxide semiconductor layer in which a microcrystalline portion (with a grain diameter greater than or equal to 1 nm and less than or equal to 20 nm, typically greater than or equal to 2 nm and less than or equal to 4 nm) is mixed in an amorphous oxide semiconductor.

The first heat treatment for the oxide semiconductor layer can be performed on the oxide semiconductor film before being processed into the island-shaped oxide semiconductor layers. In that case, the substrate is taken out from the heat apparatus after the first heat treatment, and then a photolithography step is performed.

The heat treatment having an effect of dehydration or dehydrogenation on the oxide semiconductor layer may be performed at any of the following timings: after the oxide semiconductor layer is deposited; after a source electrode and a drain electrode are stacked over the oxide semiconductor layer; and after a gate insulating layer is formed over the source electrode and the drain electrode.

However, as long as a highly purified oxide semiconductor layer with hydrogen concentration sufficiently reduced at the time of the deposition can be obtained, the first heat treatment is not necessarily performed. In the case where the highly purified oxide semiconductor layer with hydrogen concentration sufficiently reduced at the time of the deposition is formed, the substrate is held in a treatment chamber kept in a reduced pressure state and the substrate is heated to a temperature of higher than or equal to room temperature and lower than 400° C. Then, a sputtering gas from which hydrogen and moisture are removed is introduced into the treatment chamber while remaining moisture therein is removed and a metal oxide is used as a target to deposit an oxide semiconductor layer over the substrate. In the case where the deposition chamber is evacuated with a cryopump, a hydrogen atom, a compound containing a hydrogen atom, such as water ($H_2O$), (more preferably, a compound containing a hydrogen atom and a carbon atom), and the like are removed, whereby the concentration of an impurity in the oxide semiconductor layer formed in the deposition chamber can be reduced. By performing deposition by sputtering while removing moisture remaining in the treatment chamber with a cryopump, the substrate temperature when the oxide semiconductor layer is deposited can be higher than or equal to room temperature and lower than 400° C.

Next, a resist mask is formed over the third insulating layer 447b by a fourth photolithography step, and selective etching is performed so as to form an opening which reaches the electrode layer 479a.

Next, a conductive film is formed over the third insulating layer 447b and the oxide semiconductor layers 442 and 472. The conductive film may be formed by a sputtering method or a vacuum evaporation method. As a material of the conductive film, an element selected from Al, Cr, Cu, Ta, Ti, Mo, or W; an alloy containing any of these elements as a component; an alloy film containing any of these elements in combination; and the like can be given. Further, one or more materials selected from manganese, magnesium, zirconium, beryllium, and thorium may be used. Further, the metal conductive film may have a single-layer structure or a stacked-layer structure of two or more layers. For example, a single-layer structure of an aluminum film containing silicon; a two-layer structure of an aluminum film and a titanium film stacked thereover; a three-layer structure of a titanium film, an aluminum film stacked thereover, and a titanium film stacked thereover; and the like can be given. Further, a film of Al and one or more elements selected from Ti, Ta, W, Mo, Cr, Nd, and Sc, an alloy film or a nitride film thereof may be used. In this embodiment, a stacked-layer film of a titanium film (with a thickness of greater than or equal to 10 nm and less than or equal to 100 nm) and an aluminum film (with a thickness of greater than or equal to 20 nm and less than or equal to 500 nm) is formed as the conductive film.

Next, an insulating film with a thickness of greater than or equal to 200 nm and less than or equal to 2000 nm is formed over the conductive film by a plasma CVD method, a sputtering method, or the like, using a single layer or stacked layers of a silicon oxide layer, a silicon nitride layer, a silicon oxynitride layer, and/or a silicon nitride oxide layer.

Next, a resist mask is formed over the insulating film by a fifth photolithography step, selective etching is performed to form the fourth insulating layer 446, the first source electrode layer 445a, the second source electrode layer 448a, the first drain electrode layer 445b, and the second drain electrode layer 448b, and then the resist mask is removed. The fourth insulating layer 446 is provided in order to reduce parasitic capacitance between the gate electrode layer formed later and the source and drain electrode layers. It is preferable that the end portions of the source electrode layer and the drain electrode layer be tapered because coverage with the gate insulating layer stacked thereover is improved.

When the conductive film is etched, each material and etching conditions are adjusted as appropriate so that the oxide semiconductor layers 442 and 472 are not removed, whereby the third insulating layer 447b thereunder is not exposed.

In this embodiment, a titanium film is used as each of the first source electrode layer 445a and the first drain electrode layer 445b, an aluminum film is used as each of the second source electrode layer 448a and the second drain electrode layer 448b, an In—Ga—Zn—O-based film is used as the oxide semiconductor layer 442.

In the fifth photolithography step, only part of the oxide semiconductor layer 442 may be etched so that an oxide semiconductor layer having a groove (a depression portion) is formed. The resist mask used for forming the first source electrode layer 445a and the first drain electrode layer 445b may be formed by an ink jet method. Formation of the resist mask by an inkjet method needs no photomask; thus, manufacturing costs can be reduced.

In light exposure for the formation of the resist mask in the fifth photolithography step, ultraviolet light, KrF laser light, or ArF laser light is used. A channel length L1 of the transistor 440 is determined by the distance between the lower edge portion of the source electrode layer and the lower edge portion of the drain electrode layer which are next to each other over the oxide semiconductor layer 442. In the case of performing light exposure by which the channel length L1 is less than 25 nm, light exposure for forming the resist mask in the fifth photolithography step is performed using extreme ultraviolet light with extremely short wavelength of several nanometers to several tens of nanometers. Exposures with extreme ultraviolet light yield high resolution and a great depth of focus. Therefore, the channel length L1 of the transistor 440 can be greater than or equal to 10 nm and less than or equal to 1000 nm, operation speed of the circuit can be increased, and power consumption can be reduced because the off-current value is extremely small.

Next, the gate insulating layer 444 is formed over the fourth insulating layer 446, the oxide semiconductor layers 442 and 472, the first source electrode layer 445a, the second source electrode layer 448a, the first drain electrode layer 445b, and the second drain electrode layer 448b.

The gate insulating layer 444 can be formed to have a single-layer structure or a stacked-layer structure using a silicon oxide layer, a silicon nitride layer, a silicon oxynitride layer, a silicon nitride oxide layer, a hafnium oxide layer, and/or an aluminum oxide layer by a plasma CVD method, a sputtering method, or the like. It is preferable that the gate insulating layer 444 be formed by a sputtering method in order not to contain a large amount of hydrogen in the gate insulating layer 444. In the case where a silicon oxide layer is formed by a sputtering method, a silicon target or a quartz target is used as a target and a mixed gas of oxygen and argon or an oxygen gas is used as a sputtering target.

The gate insulating layer 444 can have a structure in which a silicon oxide layer and a silicon nitride layer are stacked over the second source electrode layer 448a and the second drain electrode layer 448b. For example, a silicon oxide layer ($SiO_x$ (x>0)) with a thickness greater than or equal to 5 nm and less than or equal to 300 nm is formed as the first gate insulating layer, and a silicon nitride layer ($SiO_y$ (y>0)) with a thickness greater than or equal to 50 nm and less than or equal to 200 nm is stacked as the second gate insulating layer over the first gate insulating layer by a sputtering method, so that a gate insulating layer with a thickness of 100 nm is formed. In this embodiment, a silicon oxide layer is formed to a thickness of 100 nm by an RF sputtering method under the following condition: the pressure is 0.4 Pa; the high frequency power is 1.5 kW; and the atmosphere is an atmosphere containing oxygen and argon (the flow ratio of oxygen is 25 sccm, and the flow ratio of argon is 25 sccm).

Next, a resist mask is formed by a sixth photolithography step, selective etching is performed so as to remove part of the gate insulating layer 444 and the fourth insulating layer 446, and an opening is formed to reach the source electrode layer or the drain electrode layer of the transistor 470.

Then, a conductive film is formed over the gate insulating layer 444 and the opening, and a seventh photolithography step is performed, so that gate electrode layers 441 and 471 and wiring layers 474a and 474b are formed. Note that a resist mask may be formed by an inkjet method. Formation of the resist mask by an inkjet method needs no photomask; thus, manufacturing costs can be reduced.

The gate electrode layers 441 and 471 and the wiring layers 474a and 474b can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of any of the gate electrode layers 441 and 471 and the wiring layers 474a and 474b, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a three-layer structure of a tungsten layer or a tungsten nitride layer, a layer of an alloy of aluminum and silicon or an alloy of aluminum and titanium, and a titanium nitride layer or a titanium layer is preferable. The gate electrode layer can be formed using a light-transmitting conductive film. As an example of the light-transmitting conductive film, a light-transmitting conductive oxide or the like can be given.

In this embodiment, a tungsten film with a thickness of 150 nm is formed as each of the gate insulating layers 441 and 471 and the wiring layers 474a and 474b.

Next, a second heat treatment is performed in an inert gas atmosphere or an oxygen gas atmosphere (preferably at a temperature higher than or equal to 200° C. and lower than or equal to 400° C., e.g. at a temperature higher than or equal to 250° C. and lower than or equal to 350° C.). In this embodiment, the second heat treatment is performed at 250° C. in a nitrogen atmosphere for one hour. The second heat treatment may be performed after a protective insulating layer or a planarizing insulating layer is formed over the transistors 440 and 470.

Further, heat treatment may be further performed at a temperature higher than or equal to 100° C. and lower than or equal to 200° C. in the air for a period longer than or equal to 1 hour and shorter than or equal to 30 hours. This heat treatment may be performed at a fixed heating temperature; alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed under a reduced pressure before formation of the third insulating layer 447b. When the heat treatment is performed under the reduced pressure, the heat treatment time can be shortened.

Through the above steps, the transistors 440 and 470 including the oxide semiconductor layers 442 and 472 respectively with a reduced concentration of hydrogen, moisture, hydride, and hydroxide can be formed (see FIG. 1B).

The transistor 470 in which parasitic capacitance between the electrode layer 479c and a fourth drain electrode layer 478b is reduced by the fifth insulating layer 473 includes a third source electrode layer 475a, a fourth source electrode layer 478a, a third drain electrode layer 475b, and the fourth drain electrode layer 478b. Note that the electrode layer 479c overlapping with the fifth insulating layer 473 is a gate signal line, and corresponds to a structure of a wiring intersection with the fourth drain electrode layer 478b. The third source electrode layer 475a is electrically connected to the electrode layer 479a. The fourth source electrode layer 478a is electrically connected to a wiring layer 474a. The transistor 470 is a transistor which has a channel length L2 longer than the channel length L1 of the transistor 440 and a small off-current value.

In addition, a protective insulating layer or a planarizing insulating layer for planarization may be provided over the transistors 440 and 470. For example, the protective insulating layer can be formed to have a single-layer or stacked-layer structure using a silicon oxide layer, a silicon nitride layer, a silicon oxynitride layer, a silicon nitride oxide layer, and/or an aluminum oxide layer.

The planarizing insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarizing insulating layer may be formed by stacking a plurality of insulating films formed using these materials.

The siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the planarizing insulating layer. The planarizing insulating layer can be formed, depending on a material thereof, by a sputtering method, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater, or the like.

The electrode layer 479b provided below the oxide semiconductor layer 472 of the transistor 470 can function as a back gate. The potential of the back gate can be a fixed potential, e.g., 0V, or a ground potential, and may be determined as appropriate. In addition, by providing the gate electrodes above and below the oxide semiconductor layer, in a bias-temperature stress test (hereinafter, referred to as a BT test) for examining reliability of the transistor, the amount of shift in threshold voltage of the transistor by the BT test can be reduced. That is, provision of the gate electrodes above and below the oxide semiconductor layer can improve the reliability.

Further, by controlling gate voltage applied to the electrode layer 479b, the threshold voltage can be controlled. By setting the threshold voltage to be positive, the transistor can be functioned as an enhancement type transistor. Alternatively, by setting the threshold voltage to be negative, the transistor can be functioned as a depletion type transistor.

For example, an inverter circuit including a combination of an enhancement type transistor and a depletion type transistor (hereinafter, the circuit is referred to as an EDMOS circuit) can be formed to be used for a driver circuit. The driver circuit includes at least a logic circuit portion, and a switch portion or a buffer portion. The logic circuit portion has a circuit structure including the above-described EDMOS circuit. Further, it is preferable that a transistor by which large on-current can flow be used for the switch portion or the buffer portion; a depletion type transistor or a transistor including gate electrodes above and below an oxide semiconductor layer is used.

Transistors having different structures can be formed over one substrate without greatly increasing the number of steps. For example, an EDMOS circuit can be formed using the transistor including gate electrodes above and below an oxide semiconductor layer, in an integrated circuit for high-speed driving, and a transistor including a gate electrode above an oxide semiconductor layer can be formed in another region.

Note that an n-channel TFT whose threshold voltage is positive is referred to as an enhancement type transistor, and an n-channel TFT whose threshold voltage is negative is referred to as a depletion type transistor, in this specification.

In the transistors 470 and 440, when a silicon nitride film is used for both the gate insulating layer 444 and the first insulating layer 447a, the oxide semiconductor layers 442 and 472 can be sandwiched by the silicon nitride films, and the entry of hydrogen or moisture can be effectively blocked. With such a structure, the concentrations of hydrogen included in the oxide semiconductor layers 442 and 472 can be extremely reduced, and entry of hydrogen can be prevented.

In this manner, a transistor which is formed over a semiconductor substrate and includes an oxide semiconductor layer with sufficiently reduced hydrogen concentration is used, whereby generation of a parasitic channel can be suppressed, the leakage current can be extremely decreased, and parasitic capacitance can be decreased. Further, since the transistor in accordance with this embodiment is provided over the semiconductor substrate, the transistor can be shielded from static electricity as compared to the case of using an insulating substrate. By shielding the transistor from static electricity, the number of carriers due to static electricity can be reduced. This transistor is used in the semiconductor integrated circuit described in Embodiment 1, so that a semiconductor device power consumption thereof is small can be attained.

Embodiment 2

In Embodiment 2, an example of forming an inverter circuit of an integrated circuit with the use of two n-channel transistors will be described. The manufacturing process of the transistor is almost the same as that in Embodiment 1, and therefore, only a difference is described in detail.

The integrated circuit is formed using an inverter circuit, a capacitor, a resistor, and the like; therefore, a process of forming a capacitor and two kinds of resistors over the same substrate in addition to the inverter circuit is also described.

When the inverter circuit is formed using two n-channel TFTs in combination, there are the following cases: an EDMOS circuit having a combination of an enhancement type transistor and a depletion type transistor; and an inverter circuit having a combination of two enhancement type TFTs (hereinafter, referred to as an EEMOS circuit).

Figure 2:
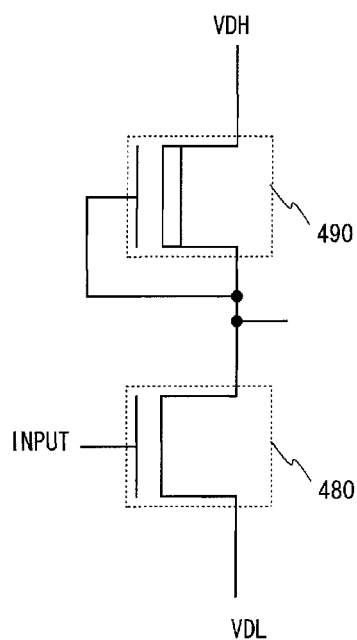
FIG. 2 is an equivalent circuit diagram illustrating one embodiment of the present invention.

In Embodiment 2, an example of the EDMOS circuit is described. An equivalent circuit of the EDMOS circuit is illustrated in FIG. 2. A cross-sectional structure of the inverter circuit is illustrated in FIG. 3.

Figure 3:
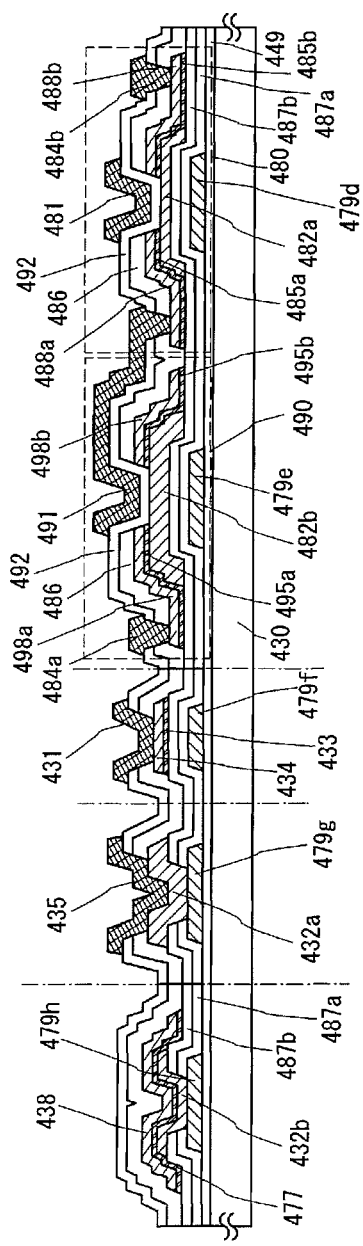
FIG. 3 is a cross-sectional view illustrating one embodiment of the present invention.

The circuit connection in FIG. 3 corresponds to FIG. 2. An example in which a first transistor 480 is an enhancement type n-channel transistor and a second transistor 490 is a depletion type n-channel transistor is illustrated.

In FIG. 3, an insulating film 449 and electrode layers 479d, 479e, 479f, 479g, and 479h are provided over a semiconductor substrate 430. The electrode layers 479d, 479e, 479f, 479g, and 479h can be formed by the same step and using the same material as the electrode layers 479a, 479b, and 479c in Embodiment 1.

A voltage is applied to the electrode layer 479d and the first transistor 480 functions as an enhancement type transistor whose threshold voltage is set to be positive. A voltage is also applied to the electrode layer 479e and the second transistor 490 functions as a depletion type transistor whose threshold voltage is set to be negative.

The electrode layer 479f is one electrode included in the capacitor. The electrode layer 479g is one electrode connected to a first resistor. The electrode layer 479h is one electrode connected to a second resistor.

A first insulating layer 487a and a third insulating layer 487b are formed so as to cover the electrode layers 479d, 479e, 479f, 479g, and 479h. Note that although not shown, in a region where parasitic capacitance is to be reduced, a second insulating layer serving as a spacer insulating layer is provided as described in Embodiment 1. In the capacitor portion, the first insulating layer 487a overlapping with the electrode layer 479f and the third insulating layer 487b overlapping with the electrode layer 479f correspond to a dielectric.

In this embodiment, unlike Embodiment 1, the second oxide semiconductor layer 482b has a thickness larger than that of the first oxide semiconductor layer 482a. Deposition and patterning are each performed twice to make the second oxide semiconductor layer 482b thick. With such a large thickness, the second transistor 490 can function as a depletion type transistor. Since a voltage by which the threshold voltage is made to be negative need not necessarily be applied to the electrode layer 479e, the electrode layer 479e can be omitted.

A third oxide semiconductor layer 432b formed to have the same thickness as the first oxide semiconductor layer 482a functions as a first resistor. An opening is formed in the first insulating layer 487a and the third insulating layer 487b which overlap with the electrode layer 479h, and the third oxide semiconductor layer 432b and the electrode layer 479h are electrically connected to each other through the opening. A fourth oxide semiconductor layer 432a formed to have the same thickness as the second oxide semiconductor layer 482b functions as a second resistor, whose resistance value is different from that of the first resistor. An opening is formed in the first insulating layer 487a and the third insulating layer 487b which overlap with the electrode layer 479g, and the fourth oxide semiconductor layer 432a and the electrode layer 479g are electrically connected to each other through the opening.

The first transistor 480 includes a first gate electrode layer 481 and the first oxide semiconductor layer 482a which overlaps with the first gate electrode layer 481 with a gate insulating layer 492 provided therebetween. A first source electrode layer 485b which is in contact with part of the first oxide semiconductor layer 482a is electrically connected to a first wiring 484b. The first wiring 484b is a power supply line to which a negative voltage VDL is applied (a negative power supply line). This power supply line may be a power supply line with a ground potential (a ground potential power supply line).

The first source electrode layer 485b is formed using the same material as the first source electrode layer 445a in Embodiment 1, and the second source electrode layer 488b which is formed on and in contact with the first source electrode layer 485b is formed using the same material as the second source electrode layer 448a in Embodiment 1. In Embodiment 1, an example in which the insulating layer is formed and then patterned using the same mask as a mask of the insulating film is described; however, in this embodiment, the insulating film is formed after the conductive layer is patterned. Then, the insulating film is selectively removed to form an insulating layer 486, the conductive layer is selectively etched using the insulating layer 486 as a mask, so that the first source electrode layer 485b, the second source electrode layer 488b, a first drain electrode layer 485a, and a second drain electrode layer 488a are formed. The insulating layer 486 is provided to reduce parasitic capacitance between a second gate electrode layer 491 and a fourth drain electrode layer 498b which are formed later.

In the capacitor portion, a first capacitor electrode layer 433 is formed by the same step and using the same material as the first source electrode layer 485b, and a second capacitor electrode layer 434 is formed by the same step and using the same material as the second source electrode layer 488b. The first capacitor electrode layer 433 and the second capacitor electrode layer 434 overlap with the electrode layer 479f.

A first electrode layer 477 is formed on and in contact with the third oxide semiconductor layer 432b which is the first resistor, by the same step and using the same material as the first source electrode layer 485b. A second electrode layer 438 is formed on and in contact with the first electrode layer 477 by the same step and using the same material as the second source electrode layer 488b.

The second transistor 490 includes the second gate electrode layer 491 functioning as a second wiring and the second oxide semiconductor layer 482b which overlaps with the second gate electrode layer 491 with the gate insulating layer 492 provided therebetween. A third wiring 484a is a power supply line (a positive power supply line) to which a positive voltage VDH is applied.

The second transistor 490 further includes a third source electrode layer 495a which is partly in contact with and overlaps with the second oxide semiconductor layer 482b and a fourth source electrode layer 498a. The second transistor 490 further includes a third drain electrode layer 495b which is partly in contact with and overlaps with the second oxide semiconductor layer 482b and the fourth drain electrode layer 498b. The third source electrode layer 495a and the third drain electrode layer 495b are formed by the same step and using the same material as the first source electrode layer 485b. The fourth source electrode layer 498a and the fourth drain electrode layer 498b are formed by the same step and using the same material as the second source electrode layer 488b.

An opening is formed in the insulating layer 486 to reach the second drain electrode layer 488a. The second drain electrode layer 488a is electrically connected to the second gate electrode layer 491 functioning as a second wiring, whereby the first transistor 480 and the second transistor 490 are connected to form an EDMOS circuit.

A fourth wiring 431 which is connected to the second capacitor electrode layer 434 through an opening in the gate insulating layer 492 in a region overlapping with the electrode layer 479f, functions as a capacitor wiring.

A fifth wiring 435 is in contact with the fourth oxide semiconductor layer 432a which functions as the second resistor, through an opening in the gate insulating layer 492 in a region overlapping with the electrode layer 479g.

In this embodiment, an example in which an EDMOS circuit, a capacitor portion, a first resistor, and a second resistor are formed over one substrate is described; however, the present invention is not particularly limited thereto, and the transistor described in Embodiment 1 can also be formed over the same substrate.

Figure 4A:
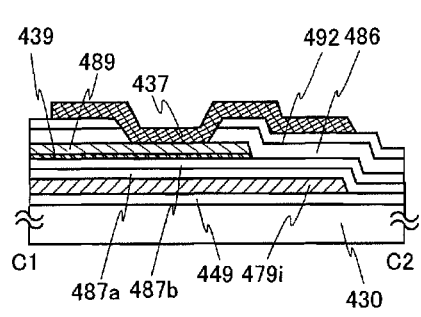
FIGS. 4A and 4B are a cross-sectional view and a top view illustrating one embodiment of the present invention.
Figure 4B:
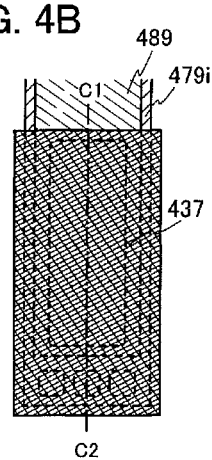

A cross-sectional structure of a terminal portion of a wiring which can be formed over the same substrate in this embodiment is illustrated in FIGS. 4A and 4B. FIG. 4A is a cross-sectional view taken along line C1-C2 of FIG. 4B.

In FIG. 4A, a conductive layer 437 formed over a stack of the insulating layer 486 and the gate insulating layer 492 is a terminal electrode for connection which functions as an input terminal. In FIG. 4A, an electrode layer 479i which is formed of the same material as the electrode layers 479d, 479e, 479f, 479g, and 479h is provided below and overlaps with a first terminal electrode layer 439 which is electrically connected to the first source electrode layer 485b, with the first insulating layer 487a and the third insulating layer 487b provided therebetween. The electrode layer 479i is not electrically connected to the first terminal electrode layer 439, and a capacitor as a countermeasure against noise or static electricity can be formed by setting the potential of the electrode layer 479i so as to be different from that of the first terminal electrode layer 439, for example, to be floating, GND, 0 V, or the like. The first terminal electrode layer 439, over which a second terminal electrode layer 489 is provided, is electrically connected to the conductive layer 437 with the insulating layer 486 and the gate insulating layer 492 provided therebetween.

The first terminal electrode layer 439 can be formed using the same material and by the same step as the first source electrode layer 485b. The second terminal electrode layer 489 can be formed using the same material and by the same step as the second source electrode layer 488*b*. The conductive layer 437 can be formed using the same material and by the same step as the first gate electrode layer 481.

Embodiment 2 can be combined with Embodiment 1 as appropriate.

Embodiment 3

In Embodiment 3, an example of manufacturing a CPU (central processing unit) with the use of the EDMOS circuit described in Embodiment 2 will be described.

Figure 5:
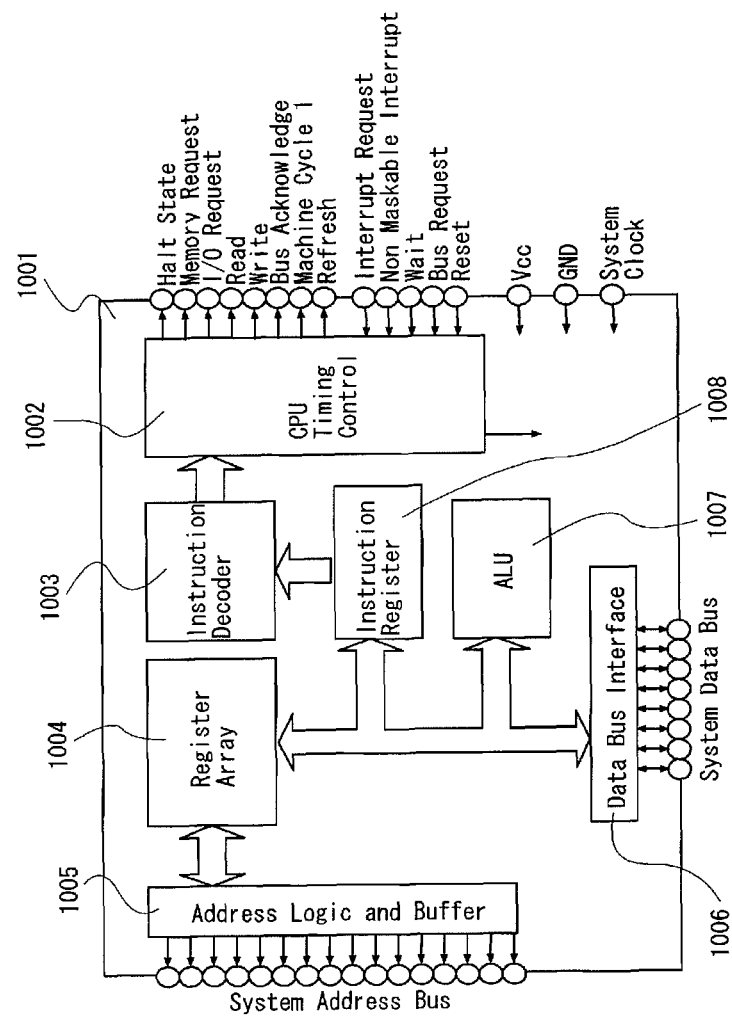
FIG. 5 is a block diagram illustrating one embodiment of the present invention.

An example of a block diagram of a CPU is illustrated in FIG. 5. A CPU 1001 illustrated in FIG. 5 includes a timing control 1002, an instruction decoder 1003, a register array 1004, an address logic and buffer 1005, a data bus interface 1006, an ALU 1007, an instruction register 1008, and the like.

These circuits are manufactured using the transistor, the inverter circuit, the resistor, the capacitor, and the like described in Embodiment 1 or Embodiment 2. Since the transistor described in Embodiment 1 or 2 is formed over a semiconductor substrate and includes an oxide semiconductor layer with sufficiently reduced hydrogen concentration, the off-current of the transistor can be reduced to be extremely small value. Therefore, at least part of the CPU 1001 is formed using the transistor which is formed over a semiconductor substrate and includes an oxide semiconductor layer with sufficiently reduced hydrogen concentration, low power consumption can be achieved.

Each circuit is briefly described below. The timing control 1002 receives an instruction from the outside, converts into information for the inside, and sends to another block. In addition, the timing control gives directions such as reading and writing of memory data to the outside, according to internal operation. The instruction decoder 1003 serves to convert instruction from the outside into information for the inside. The register array 1004 is a volatile memory for temporarily storing data. The address logic and buffer 1005 is a circuit for specifying the address of an external memory. The data bus interface 1006 is a circuit for taking data in and out of an external memory or a device such as a printer. The ALU 1007 is a circuit for performing an operation. The instruction register 1008 is a circuit for temporarily storing an instruction. The CPU includes combination of these circuits.

By using the transistor described in Embodiment 1 or 2 for at least part of the CPU 1001, leakage current in a standby period can be reduced; thus, power consumption of a driver circuit or the like used for electronic devices can be reduced.

Embodiment 3 can be combined with Embodiment 1 or 2 as appropriate.

Embodiment 4

In Embodiment 4, examples of usage pattern of the semiconductor device described in the above-described embodiment will be described. Specifically, description is made below on an application example of the semiconductor device capable of inputting and outputting data wirelessly with the reference to drawings. The semiconductor device capable of wirelessly inputting and outputting data is also called an RFID tag, an ID tag, an IC tag, an RF tag, a wireless tag, an electronic tag, or a wireless chip depending on the application.

One example of a top structure of a semiconductor device described in this embodiment is described with reference to FIG. 8A. The semiconductor device illustrated in FIG. 8A includes a semiconductor integrated circuit chip 400 having an antenna (also referred to as an on-chip antenna) and a supporting substrate 406 having an antenna 405 (also referred to as a booster antenna). The semiconductor integrated circuit chip 400 is provided over an insulating layer 410 that is formed over the supporting substrate 406 and the antenna 405. The semiconductor integrated circuit chip 400 can be fixed to the supporting substrate 406 and the antenna 405 by using the insulating layer 410.

Note that a conductive shield is provided on a surface of the semiconductor integrated circuit chip 400 to prevent electrostatic breakdown of the semiconductor integrated circuit (e.g., malfunction of the circuit or damage to a semiconductor element) due to electrostatic discharge. When the conductive shield has high resistance and current cannot pass through the pattern of the antenna 405, the antenna 405 and the conductive shield provided on the surface of the semiconductor integrated circuit chip 400 may be provided in contact with each other.

A semiconductor integrated circuit provided in the semiconductor integrated circuit chip 400 includes a plurality of elements such as transistors which is included in a memory portion or a logic portion. As the transistor included in the memory portion or the logic portion, a transistor including a highly purified oxide semiconductor layer with sufficiently reduced hydrogen concentration is used. In the semiconductor device in accordance with this embodiment, as well as a field-effect transistor, a memory element which uses a semiconductor layer can also be employed as a semiconductor element; accordingly, a semiconductor device which can meet functions required for various applications can be manufactured and provided.

Figure 7A:
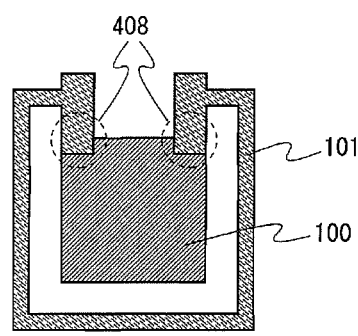
FIGS. 7A and 7B are diagrams each illustrating a semiconductor device.
Figure 8A:
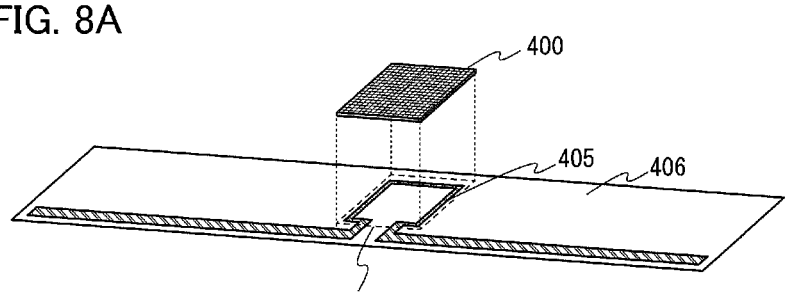
FIGS. 8A to 8C are views each illustrating a semiconductor device.

FIG. 7A is an enlarged view of the antenna and the semiconductor integrated circuit that are included in the semiconductor integrated circuit chip 400 illustrated in FIG. 8A. In FIG. 7A, an antenna 101 is a rectangular loop antenna in which the number of windings is 1; however, an embodiment of the present invention is not limited to this structure. The shape of the loop antenna is not limited to a rectangle and may be a shape with curve, for example, a circle. In addition, the number of windings is not limited to 1 and may be plural. When the number of windings of the antenna 101 is 1, parasitic capacitance generated between the semiconductor integrated circuit 100 and the antenna 101 can be reduced.

Figure 7B:
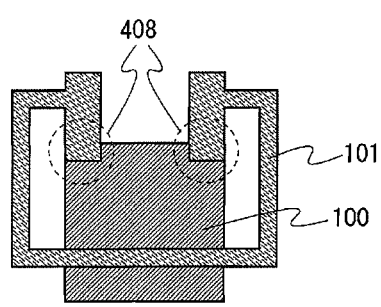

In FIG. 8A and FIG. 7A, the antenna 101 is arranged so as to surround the periphery of the semiconductor integrated circuit 100, and the antenna 101 is arranged in a region different from a region of the semiconductor integrated circuit 100, except portions corresponding to power feeding points 408 indicated by a dashed line. However, an embodiment of the present invention is not limited to this structure; as illustrated in FIG. 7B, the antenna 101 may be arranged so as to at least partly overlap with the semiconductor integrated circuit 100 in addition to the portions corresponding to the power feeding points 408 indicated by the dashed line. When the antenna 101 is arranged in a region different from a region of the semiconductor circuit 100 as illustrated in FIG. 8A and FIG. 7A, parasitic capacitance generated between the semiconductor integrated circuit 100 and the antenna 101 can be reduced.

In FIG. 8A, the antenna 405 can transmit and receive signals or supply power to/from the antenna 101 by electromagnetic induction mainly in a loop-like shaped portion surrounded by a dashed line 407. In addition, the antenna 405 can send and receive a signal to/from an interrogator or supply power by using a radio wave mainly in a region other than the portion surrounded by the dashed line 407. A radio wave used as a carrier (a carrier wave) between the interrogator and the semiconductor device preferably has a frequency of about greater than or equal to 30 MHz and less than or equal to 5 GHz, and for example, may have a frequency band of 950 MHz or 2.45 GHz.

The antenna 405 is a rectangular loop antenna in which the number of windings is 1 in the portion surrounded by the dashed line 407; however, an embodiment of the present invention is not limited to this structure. The shape of the loop antenna is not limited to a rectangle and may be a shape with curve, for example, a circle. In addition, the number of windings is not limited to 1 and may be plural.

For the semiconductor device described in Embodiment 5, an electromagnetic induction method, an electromagnetic coupling method, or a microwave method can be employed. In the case of a microwave method, the shapes of the antenna 101 and the antenna 405 may be determined as appropriate depending on the wavelength of an electromagnetic wave.

In the case where a microwave method (e.g., UHF band (860 MHz band to 960 MHz band), or 2.45 GHz band) is used as the signal transmission method in the semiconductor device, the length, shape, or the like of the antenna may be determined as appropriate in consideration of the wavelength of an electromagnetic wave used for signal transmission. For example, each of the antennas can be formed into a linear shape (e.g., a dipole antenna) or a flat shape (e.g., a patch antenna or an antenna having a ribbon shape). Further, each of the antennas is not limited to a linear shape and may have a curved shape, a serpentine curved shape, or in a shape combining them in consideration of the wavelength of the electromagnetic wave.

Figure 9:
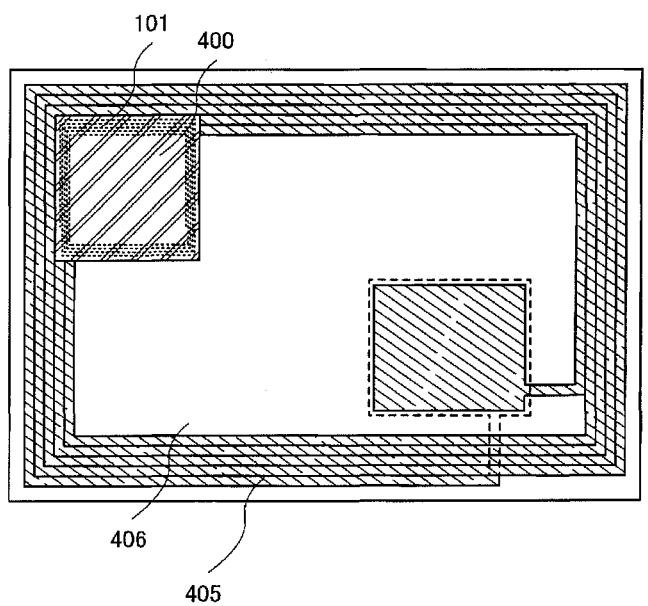
FIG. 9 is a diagram illustrating a semiconductor device.

An example in which the antenna 101 and the antenna 405 have coil shapes and an electromagnetic induction method or an electromagnetic coupling method is used is illustrated in FIG. 9.

In FIG. 9, the semiconductor integrated circuit chip 400 having the coiled antenna 101 is provided over the supporting substrate 406 provided with the coiled antenna 405 as a booster antenna. The supporting substrate 406 is sandwiched by the antenna 405 which is a booster antenna, so that a capacitor is formed.

Figure 8B:
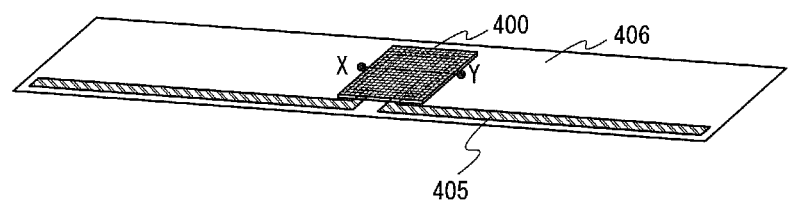

Next, the structures and arrangements of the semiconductor integrated circuit chip 400 and the booster antenna are described. FIG. 8B is a perspective view of the semiconductor device illustrated in FIG. 8A, in which the semiconductor integrated circuit chip 400 and the antenna 405 formed over the supporting substrate 406 are stacked. In addition, FIG. 8C is a cross-sectional view along dashed line X-Y of FIG. 8B.

Figure 8C:
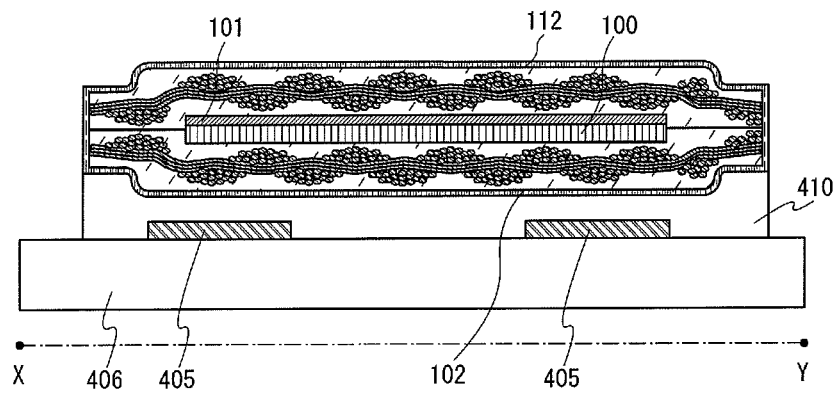

As the semiconductor integrated circuit chip 400 illustrated in FIG. 8C, any of the semiconductor devices described in Embodiment 1 and Embodiment 2 can be used. A chip obtained by cutting the semiconductor integrated circuit into individual chips is referred to as a semiconductor integrated circuit chip in this specification. Although the semiconductor integrated circuit chip illustrated in FIG. 8C is an example of using Embodiment 1, this embodiment is not limited to this structure and can be applied to another embodiment.

The semiconductor integrated circuit 100 illustrated in FIG. 8C is sandwiched by a first insulator 112 and a second insulator 102, and the side surface thereof is also sealed. In this embodiment, the first insulator and the second insulator between which a plurality of semiconductor integrated circuits is sandwiched are attached, and then the semiconductor integrated circuits are individually divided into stacks. A conductive shield is formed each for the divided stacks, whereby the semiconductor integrated circuit chips 400 are formed. There is no particular limitation on a separation means as long as physical separation is possible, and separation is performed by laser beam irradiation in this embodiment.

In FIG. 8C, the semiconductor integrated circuit 100 is closer to the antenna 405 than the antenna 101; however an embodiment of the present invention is not limited to this structure. The antenna 101 may be closer to the antenna 405 than the semiconductor integrated circuit 100. The semiconductor integrated circuit 100 and the antenna 101 may be directly attached to the first insulator 112 and the second insulator 102, or may be attached by a bonding layer functioning as an adhesive.

Figure 6:
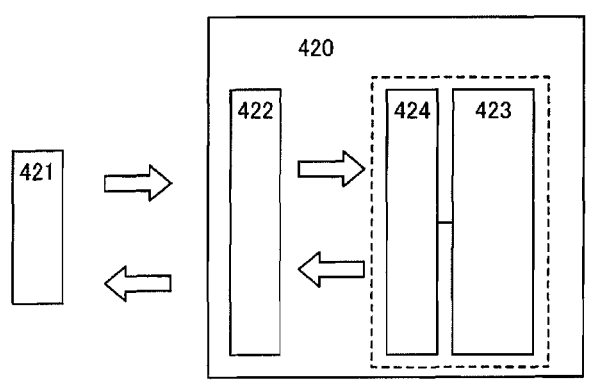
FIG. 6 illustrates a semiconductor device.

Next, operation of the semiconductor device of this embodiment is described. FIG. 6 is an example of a block diagram illustrating a structure of the semiconductor device of this embodiment. A semiconductor device 420 illustrated in FIG. 6 includes an antenna 422 as a booster antenna, a semiconductor integrated circuit 423, and an antenna 424 as an on-chip antenna. When an electromagnetic wave is transmitted from an interrogator 421, the antenna 422 receives the electromagnetic wave to generate alternate current, whereby a magnetic field is generated around the antenna 422. Then, a loop portion of the antenna 422 is electromagnetically coupled to the loop antenna 424, so that induced electromotive force is generated in the antenna 424. The semiconductor integrated circuit 423 receives a signal or power from the interrogator 421 by using the induced electromotive force. On the other hand, current flows into the antenna 424 and induced electromotive force is generated in the antenna 422 in accordance with a signal generated in the semiconductor integrated circuit 423, whereby a signal can be transmitted to the interrogator 421 by using a reflected wave of the radio wave that is transmitted from the interrogator 421.

The antenna 422 can be divided into the loop portion that is mainly electromagnetically coupled to the antenna 424 and a portion that mainly receives electromagnetic waves from the interrogator 421. The shape of the antenna 422 in the portion that mainly receives an electric wave from the interrogator 421 has a shape in which an electric wave can be received. For example, the shape of a dipole antenna, a folded dipole antenna, a slot antenna, a meander line antenna, a microstrip antenna, or the like may be used.

Although FIGS. 8A to 8C illustrate the structure of the semiconductor integrated circuit having one antenna, an embodiment of the present invention is not limited to this structure. The semiconductor device may include two antennas, that is, an antenna for receiving power and an antenna for receiving a signal. With two antennas, frequency of a radio wave for supplying power and frequency of a radio wave for sending a signal can be separately used.

In the semiconductor device of this embodiment, the on-chip antenna is used and a signal or power can be sent and received between the booster antenna and the on-chip antenna without contact; therefore, unlike the case where an external antenna is connected to a semiconductor integrated circuit, the semiconductor integrated circuit and the antenna are less likely to be disconnected due to external force, and generation of initial failure in the connection can also be suppressed. In addition, since the booster antenna is used in this embodiment, unlike the case where only the on-chip antenna is used, the advantage of an external antenna can also be offered: that is, the area of the semiconductor integrated circuit does not significantly limit the size or shape of the on-chip antenna, the frequency band of radio waves capable of being received is not limited, and the communication distance can be increased.

A transistor which is formed over a semiconductor substrate and includes a highly purified oxide semiconductor layer with sufficiently reduced hydrogen concentration has a small off-current, so that low power consumption can be realized. Further, by the conductive shield covering the semiconductor integrated circuit, electrostatic breakdown of the semiconductor integrated circuit (malfunction of the circuit or damage of the semiconductor element) due to electrostatic discharge can be prevented.

Embodiment 5

In Embodiment 5, description will be made on an application example of a semiconductor device capable of inputting and outputting data wirelessly, formed using the above-described device formed in Embodiment 4. Depending on its mode of use, the semiconductor device capable of inputting and outputting data wirelessly may also be referred to as an RFID tag, an ID tag, an IC tag, an IC chip, an RF tag, a wireless tag, an electronic tag, or a wireless chip.

Figure 10A:
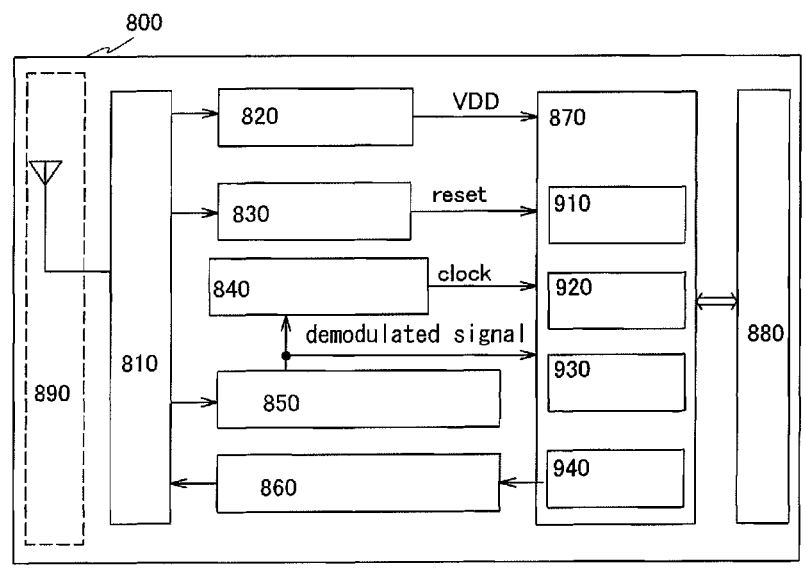
FIGS. 10A to 10C are a diagram and views each illustrating a semiconductor device.

A semiconductor device 800 has a function of communicating data wirelessly, and includes a high-frequency circuit 810, a power supply circuit 820, a reset circuit 830, a clock generating circuit 840, a data demodulating circuit 850, a data modulating circuit 860, a control circuit 870 which controls another circuit, a memory circuit 880, and an antenna 890 (see FIG. 10A). The high-frequency circuit 810 is a circuit which receives signals from the antenna 890, and outputs signals received from the data modulating circuit 860 to the antenna 890; the power supply circuit 820 is a circuit which generates power supply potentials from signals received; the reset circuit 830 is a circuit which generates reset signals; the clock generating circuit 840 is a circuit which generates various clock signals based on the received signals input from the antenna 890; the data demodulating circuit 850 is a circuit which demodulates the received signals and outputs to the control circuit 870; and the data modulating circuit 860 is a circuit which modulates the signals received from the control circuit 870. Further, as the control circuit 870, a code extraction circuit 910, a code determination circuit 920, a CRC determination circuit 930, and an output unit circuit 940 are provided, for example. The code extraction circuit 910 is a circuit which extracts a plurality of codes included in an instruction transmitted to the control circuit 870; the code determination circuit 920 compares the extracted code with a reference code to determine the content of the instruction; and the CRC determination circuit 930 detects a transmission error and the like based on the determined code.

Next, an example of an operation of the above-described semiconductor device is described. First, a radio signal is received by the antenna 890. The radio signal is transmitted to the power supply circuit 820 via the high frequency circuit 810, so that a high power supply potential (hereinafter referred to as a VDD) is generated. VDD is supplied to each circuit of the semiconductor device 800. A signal transmitted to the data demodulating circuit 850 via the high frequency circuit 810 is demodulated (hereinafter referred to as a demodulated signal). Further, a signal and a demodulated signal passing through the reset circuit 830 and the clock generating circuit 840 via the high frequency circuit 810 are transmitted to the control circuit 870. The signals transmitted to the control circuit 870 are analyzed by the code extraction circuit 910, the code determination circuit 920, the CRC determination circuit 930, and the like. Then, based on the analyzed signals, data of the semiconductor device stored in the memory circuit 880 is output. The output data of the semiconductor device is encoded via the output unit circuit 940. Further, the encoded data of the semiconductor device 800 which passes through the data modulating circuit 860 is superimposed on a radio signal to be transmitted via the antenna 890. Note that a low power supply potential (hereinafter referred to as VSS) is common in the plurality of circuits included in the semiconductor device 800, and GND can be used as VSS.

In this manner, data of the semiconductor device 800 can be read by transmitting a signal from a communication device to the semiconductor device 800 and receiving a signal from the semiconductor device 800 by the communication device.

In the semiconductor device 800, a power source (battery) is not necessarily mounted and power source voltage may be supplied to each circuit by electromagnetic waves, or a power source (battery) may be mounted so that power source voltage is supplied to each circuit by both electromagnetic waves and the power source (battery).

Figure 10B:
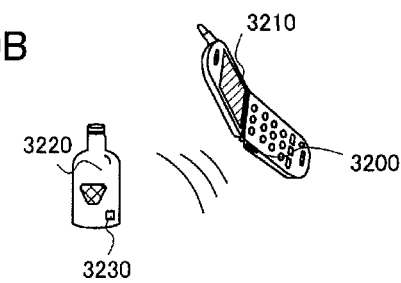
Figure 10C:
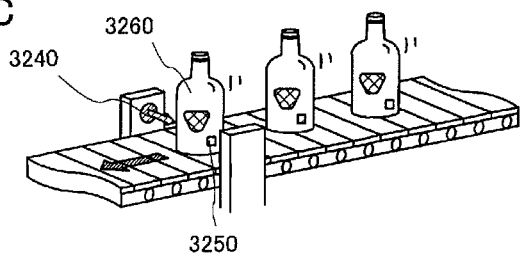

Next, an example of a usage mode of a semiconductor device capable of inputting and outputting data wirelessly is described. A communication device 3200 is provided for a side surface of a mobile terminal which includes a display portion 3210; and a semiconductor device 3230 is provided for a side surface of an object 3220 (FIG. 10B). When the communication device 3200 is put close to the semiconductor device 3230 on the object 3220, information on the object 3220, such as the raw material or the source of the object, inspection result in each production step, history of the distribution process, and explanation of the object is displayed on the display portion 3210. When an object 3260 is transferred by a conveyer belt, the object 3260 can be inspected using a communication device 3240 and a semiconductor device 3250 provided on the object 3260 (FIG. 10C). By using the semiconductor device in a system in this manner, data can be obtained easily, and higher performance and higher added value are achieved.

As described above, a semiconductor device in accordance with the present invention, which has a very wide range of application, can be used in electronic devices in various fields.

Embodiment 6

The transistors obtained in Embodiment 1 or 2 are transistors each using a highly purified oxide semiconductor. By forming a circuit using the transistor, low power consumption can be realized and operation of a memory circuit can be stabilized.

In Embodiment 6, an example of a memory circuit which can be formed using the transistor described in Embodiment 1 will be described.

Figure 11A:
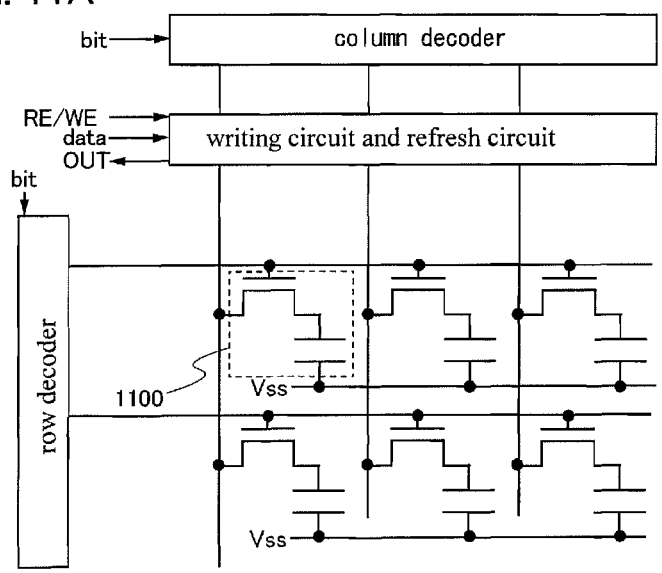
FIGS. 11A and 11B are equivalent circuit diagrams illustrating one embodiment of the present invention.

FIG. 11A is a block diagram of an example of a memory circuit. The memory circuit illustrated in FIG. 11A includes a row decoder, a writing circuit and a refresh circuit, a column decoder, and memory elements 1100 arranged in matrix. A signal line connected to the memory elements 1100 arranged in matrix is connected to the row decoder through the writing circuit and the refresh circuit, and a scan line connected to the memory elements 1100 arranged in matrix is connected to the column decoder. A bit signal is input to the row decoder. A read enable signal/a write enable signal (RE/WE), a data signal (data), and an output signal (OUT) are input to the writing circuit and the refresh circuit.

Each of the memory elements 1100 arranged in matrix includes a capacitor and a transistor. One of a source and a drain of the transistor is connected to the signal line, and the other of the source and the drain of the transistor is connected to one electrode of the capacitor, and the other electrode of the capacitor is connected to the low potential side (preferably, a reference potential Vss).

Figure 11B:
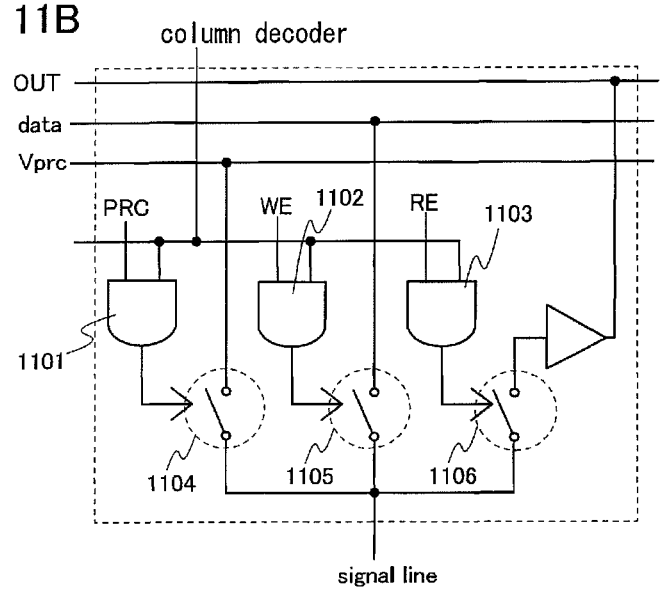

FIG. 11B illustrates a specific structural example of the refresh circuit provided in the writing circuit and the refresh circuit shown in FIG. 11A.

The writing circuit and the refresh circuit shown in FIG. 11B include an AND circuit and a sense amplifier. To one input of each of a first AND circuit 1101, a second AND circuit 1102, and a third AND circuit 1103, a signal is input from the row decoder. A PRC signal is input to the other input of the first AND circuit 1101, the write enable signal (WE) is input to the other input of the second AND circuit 1102, and the read enable signal (RE) is input to the other input of the third AND circuit 1103. The output of the first AND circuit 1101 controls on/off of a first switch 1104, the output of the second AND circuit 1102 controls on/off of a second switch 1105, and the output of the third AND circuit 1103 controls on/off of a third switch 1106. A pre-charge signal line Vprc is connected to the signal line through the first switch 1104, and a data signal line data is connected to the signal line through the second switch 1105.

The signal line connected though the first switch 1104 and the second switch 1105 is connected to the sense amplifier through the third switch 1106. A signal is output to the output signal line (OUT) from the sense amplifier.

The above-described AND circuit may have a general structure, and preferably has a simple structure.

The sense amplifier is a circuit having a function of amplifying a signal which is input.

In this specification, as a signal, an analog signal or a digital signal which uses voltage, current, resistance, frequency, or the like can be used, for example. For example, at least two potentials, that is, a first potential and a second potential are set, a high-level (also referred to as high potential or $V_H$) potential is used as the first potential, and a low-level (also referred to as low potential or $V_L$) potential is used as the second potential, whereby a binary digital signal can be set. Although $V_H$ and $V_L$ are preferably constant values, $V_H$ and $V_L$ each may take a range of values, in consideration of influence of noise.

Note that here, terms with ordinal numbers, such as "first" and "second", are used in order to avoid confusion among components, and the terms do not limit the components numerically.

The memory circuit described above can be manufactured using the transistor described in Embodiment 1 and the capacitor described in Embodiment 2.

A refresh timing of the memory circuit is determined to a certain time interval in the design phase, based on the leakage current of a memory element which is evaluated in advance. That is, the refresh timing is set in consideration of the temperature dependence of leakage current, the manufacturing process, and the like after the chip is completed.

In the transistor described in Embodiment 1 or Embodiment 2, the oxide semiconductor layer with sufficiently reduced hydrogen concentration, which is formed over a semiconductor substrate is used, whereby the off-current of the transistor can be made extremely small. Further, the temperature characteristics of the off-current hardly change within the temperature of from −30° C. to 120° C., and an extremely small value can be kept.

Therefore, by using the transistor described in Embodiment 1 or Embodiment 2, refresh interval can be set long compared to a transistor using silicon, and power consumption in a standby period can be reduced.

The memory circuit in this embodiment is suitable for in-vehicle electronic devices. Since the semiconductor substrate is used as the back gate, generation of parasitic capacitance can be suppressed, the leakage current in a standby period is extremely small, and in the case of an electric vehicle, the traveling distance per a certain amount of charging is prevented from being varied even when the standby period is long.

The oxide semiconductor included in the transistor described in Embodiment 1 or 2 is a semiconductor which is intrinsic or substantially intrinsic, in which impurities which may become carrier donors are reduced to an extremely small number.

Figure 12:
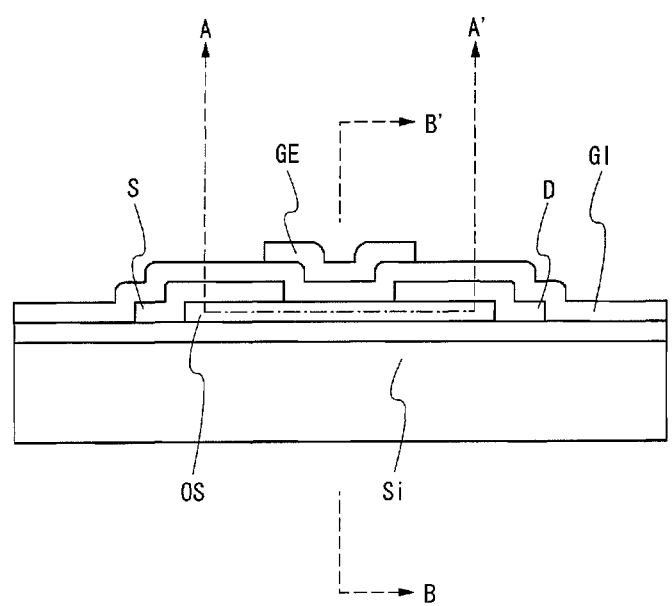
FIG. 12 is a cross-sectional view of a top-gate transistor including an oxide semiconductor.

Characteristics of the transistor including a highly purified oxide semiconductor layer are described using FIG. 12, FIGS. 13A and 13B, FIGS. 14A and 14B, and FIG. 15. FIG. 12 is a cross-sectional view of a top-gate transistor including an oxide semiconductor. An oxide semiconductor layer (OS) is provided over a semiconductor substrate (Si) with a thermally-oxidized film provided therebetween, and a source electrode (S) and a drain electrode (D) are provided over the oxide semiconductor layer (OS), and a gate electrode (GE) is provided over the source electrode (S) and the drain electrode (D) with a gate insulating film (GI) provided therebetween.

Figure 13A:
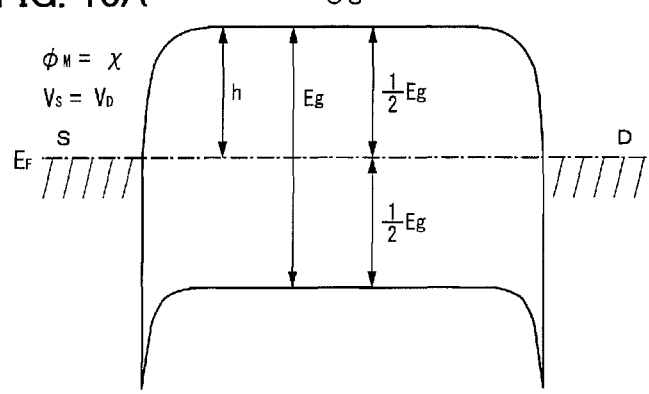
FIGS. 13A and 13B are energy band diagrams of a cross section along A-A' shown in FIG. 12.
Figure 13B:
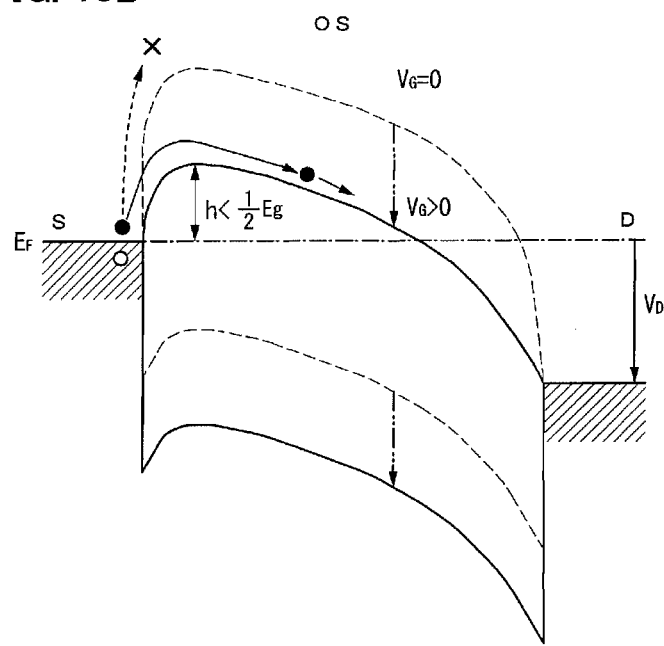

FIGS. 13A and 13B are energy band diagrams (schematic diagrams) of an A-A' section in FIG. 12. FIG. 13A illustrates the case where the potential of a voltage applied to the source is equal to the potential of a voltage applied to the drain ($V_D$=0 V), and FIG. 13B illustrates the case where a positive potential with respect to the source is applied to the drain ($V_D$>0).

Figure 14A:
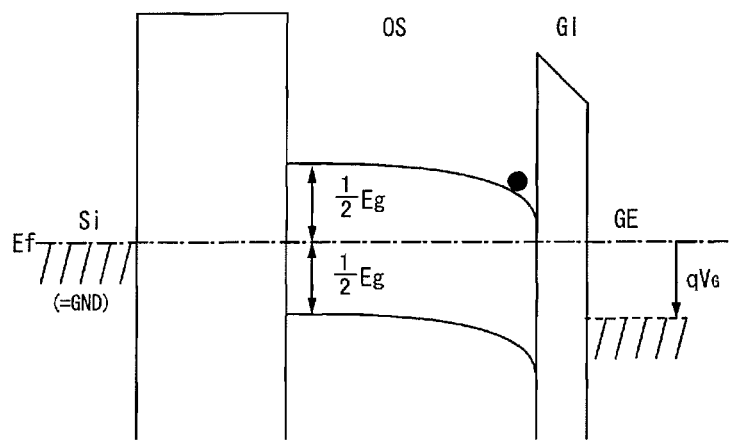
FIGS. 14A and 14B are energy band diagrams of a cross section along B-B' shown in FIG. 12.
Figure 14B:
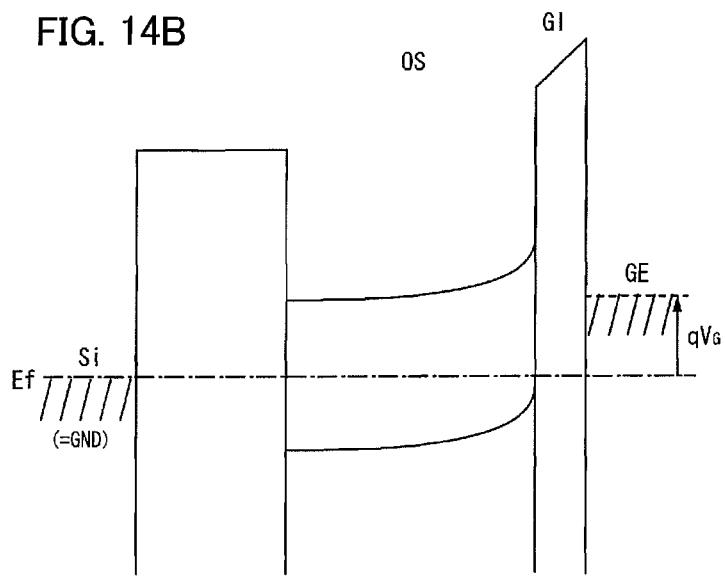

FIGS. 14A and 14B are energy band diagrams (schematic diagrams) of a B-B' section in FIG. 12. FIG. 14A illustrates a state where a positive potential ($qV_G$) is applied to the gate electrode (GE) and an on state where carriers (electrons) flow between the source electrode and the drain electrode. FIG. 14B illustrates a state where a negative potential ($qV_G$) is applied to the gate electrode (GE) and an off state (a minority carrier does not flow).

Figure 15:
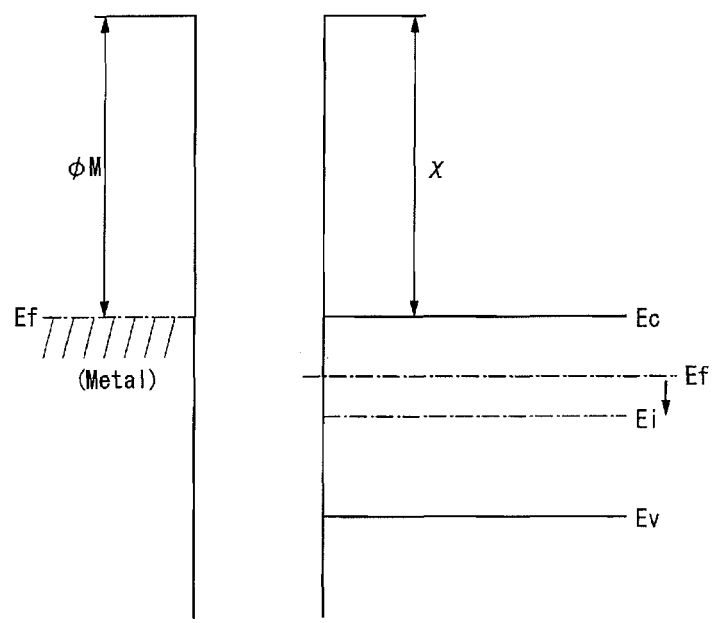
FIG. 15 is a diagram illustrating a relation between a vacuum level and a work function ($\phi$M) of a metal and a relation between a vacuum level and electron affinity ($\chi$) of an oxide semiconductor.

FIG. 15 illustrates the relationships between the vacuum level and the work function ($\phi M$) of a metal and between the vacuum level and the electron affinity ($\chi$) of an oxide semiconductor.

The metal is degenerated, and the Fermi level is positioned in the conduction band. On the other hand, a conventional oxide semiconductor is typically an n-type semiconductor; in that case, the Fermi level (Ef) is away from the intrinsic Fermi level (Ei) located in the middle of a band gap and is located closer to the conduction band. It is known that part of hydrogen becomes a donor in an oxide semiconductor and is one factor causing the oxide semiconductor to be an n-type semiconductor.

On the other hand, the oxide semiconductor in accordance with the present invention is an intrinsic (i-type) or a substantially intrinsic oxide semiconductor which is obtained by removing hydrogen that is an n-type impurity from an oxide semiconductor to purify the oxide semiconductor so that an impurity other than main components of the oxide semiconductor is prevented from being contained therein as much as possible. In other words, a feature lies in that a highly purified i-type (intrinsic) semiconductor, or a semiconductor close thereto, is obtained not by adding an impurity but by removing an impurity such as hydrogen or water as much as possible. This enables the Fermi level (Ef) to be at the same level as the intrinsic Fermi level (Ei).

In the case where the band gap (Eg) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

That is, in the case where the work function of metal ($\phi M$) and the electron affinity ($\chi$) of the oxide semiconductor are equal to each other and the metal and the oxide semiconductor are in contact with each other, an energy band diagram (a schematic diagram) as illustrated in FIG. 13A is obtained.

In FIG. 13B, a black circle (●) denotes an electron. In FIG. 13B, the case where a positive voltage ($V_D>0$) is applied to the drain, the case where a voltage is not applied to the gate ($V_G=0$) is denoted by a dashed line, and the case where a positive voltage ($V_G>0$) is applied to the gate is denoted by a solid line. In the case where a positive voltage ($V_G>0$) is applied to the gate, the positive voltage is applied to the gate, by which electrons are injected into the oxide semiconductor over a barrier (h) and flow toward the drain. The height of the barrier (h) changes depending on the gate voltage and the drain voltage; in the case where the positive voltage ($V_G>0$) is applied to the gate and a positive drain voltage is applied, the height of the barrier (h) is smaller than the height of the barrier in FIG. 13A where no voltage is applied, i.e., ½ of the band gap (Eg). In the case where a voltage is not applied to the gate, carriers (electrons) are not injected from the electrode to the oxide semiconductor side because of high potential barrier, and an off state where no current flows is shown. In contrast, in the case where a positive voltage is applied to the gate, the transistor is in an on state in which potential barrier is lowered and current flows.

At this time, the electrons move in the bottom, which is energetically stable, on the oxide semiconductor side at the interface between the gate insulating film and the highly purified oxide semiconductor as illustrated in FIG. 14A.

In FIG. 14B, when a negative potential is applied to the gate electrode (GE), holes which are minority carriers are substantially zero; therefore, current is substantially close to zero.

For example, even when the transistor has a channel width W of $1\times10^4$ µm and a channel length of 3 µm, the off-current is $10^{-13}$ A or less and the subthreshold swing (S factor) is 0.1 V/dec. (the thickness of the gate insulating film: 100 nm) can be obtained at room temperature.

As described above, the oxide semiconductor is purified so that impurities other than main components of the oxide semiconductor are not contained as much as possible, whereby favorable operation of the transistor can be obtained. Further, since the transistor of this embodiment is provided over the semiconductor substrate, the transistor can be shielded from static electricity as compared to the case of using an insulating substrate. By shielding the transistor from static electricity, the number of carriers induced by static electricity can be reduced.

Embodiment 7

In Embodiment 7, an example of a shift register which can be formed using the transistor described in Embodiment 1 or Embodiment 2 will be described.

Figure 16A:
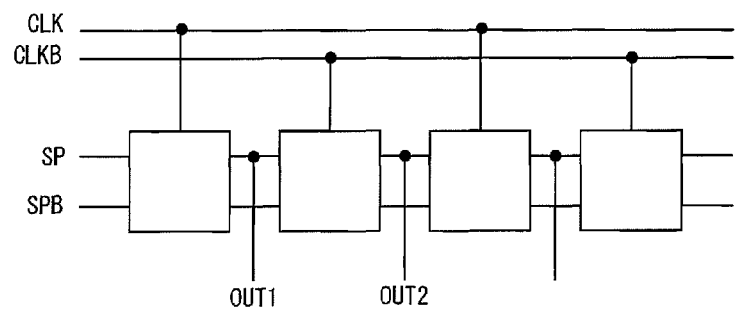
FIGS. 16A and 16B are equivalent circuit diagrams illustrating one embodiment of the present invention.

FIG. 16A is a block diagram illustrating an example of a shift register. The shift register shown in FIG. 16A includes two clock signal lines and two stages of flip-flops each of which is electrically connected to either of these clock signal lines. Note that a clock signal line may be further provided, and a larger number of stages of flip-flops may be provided.

In the two clock signal lines, each clock signal is input as follows: when one clock signal line is switched to high level ($V_H$), the other is switched to low level ($V_L$).

In the shift register illustrated in FIG. 16A, an example of a shift register is illustrated, which includes flip-flops which are in this order from a flip-flop in a first stage which is electrically connected to a first clock signal line CLK, a flip-flop in a second stage which is electrically connected to the second clock signal line CLKB, . . . , a flip-flop in an (n-1)th stage, and a flip-flop in an n-th stage. However, the present invention is not limited thereto; the shift register includes at least a first flip-flop and a second flip-flop.

The clock signal line CLK is a wiring to which a clock signal CK is input.

The clock signal line CLKB is a wiring to which a clock signal CKB is input.

The clock signal CK and the clock signal CKB can be generated using a NOT circuit (inverter circuit) for example.

A start signal SP and a start signal SPB are input to the first flip-flop, a clock signal CK is input thereto as a clock signal, and the first flip-flop outputs an output signal OUT depending on the state of the signal SP, the signal SPB, and the clock signal CK, which are input. In this specification, the state of a signal refers to a potential, a current, or a frequency of the signal, for example.

The start signal SP and the start signal SPB can be generated using a NOT circuit (inverter circuit) for example.

In this specification, as a signal, an analog signal or a digital signal which uses voltage, current, resistance, frequency, or the like can be used, for example. For example, at least two potentials, that is, a first potential and a second potential are set, a high-level (also referred to as high potential or $V_H$) potential is used as the first potential, and a low-level (also referred to as low potential or $V_L$) potential is used as the second potential, whereby a binary digital signal can be set. Although $V_H$ and $V_L$ are preferably constant values, $V_H$ and $V_L$ each may take a range of values, in consideration of influence of noise.

In this specification, terms with ordinal numbers, such as "first" and "second", are used in order to avoid confusion among components, and the terms do not limit the components numerically.

The second flip-flop has the following function: the output signal OUT of the first flip-flop is input as a start signal SP, a clock signal CK2 is input as the clock signal, and the second flip-flop outputs a signal FF2out as an output signal, which is set depending on the state of an output signal FF1out and the clock signal CK2 which are input.

A start signal SP and a start signal SPB are input to the second flip-flop, a clock signal CK2 is input thereto as a clock signal, and the second flip-flop outputs an output signal OUTB depending on the states of the signal SP, the signal SPB, and the clock signal CK2, which are input.

Figure 16B:
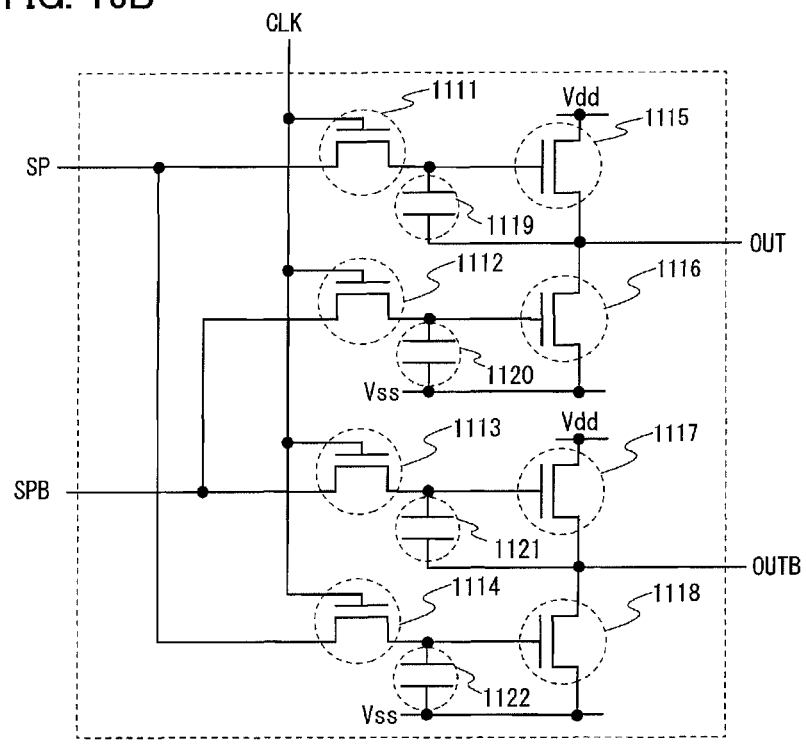

FIG. 16B illustrates a specific structural example of the first flip-flop shown in FIG. 16A.

The start signal SP is input to one of a source or a drain of a first transistor 1111 and one of a source or a drain of a fourth transistor 1114.

The start signal SPB is input to one of a source or a drain of a second transistor 1112 and one of a source or a drain of a third transistor 1113.

The clock signal CLK is input to each gate of the first transistor 1111, the second transistor 1112, the third transistor 1113, and the fourth transistor 1114.

The other of the source or the drain of the first transistor 1111 is connected to a gate of a fifth transistor 1115 and one electrode of a first capacitor 1119.

The other of the source or the drain of the second transistor 1112 is connected to a gate of a sixth transistor 1116 and one electrode of a second element 1120.

The other of the source or the drain of the third transistor 1113 is connected to a gate of a seventh transistor 1117 and one electrode of a third element 1121.

The other of the source or the drain of the fourth transistor 1114 is connected to a gate of an eighth transistor 1118 and one electrode of a fourth capacitor element 1122.

A drain of the fifth transistor 1115 is connected to a high potential side (preferably, a power supply potential Vdd). A source of the fifth transistor 1115 is connected to the other electrode of the first capacitor 1119 and a drain of the sixth transistor 1116, and outputs an output signal OUT. The other electrode of the second capacitor 1120 and a source of the sixth transistor 1116 are connected to a low potential side (preferably, a reference potential Vss).

A drain of the seventh transistor 1117 is connected to the high potential side (preferably, the power supply potential Vdd). A source of the seventh transistor 1117 is connected to the other electrode of the third capacitor 1121 and a drain of the eighth transistor 1118, and outputs an output signal OUTB. The other electrode of the fourth capacitor 1122 and a source of the eighth transistor 1118 are connected to the low potential side (preferably, the reference potential Vss).

The first capacitor 1119, the second capacitor 1120, the third capacitor 1121, and the fourth capacitor 1121 can be formed over the same substrate as the transistor, using the capacitor described in Embodiment 2.

The flip-flop circuit described above can be manufactured using the transistor including a highly purified oxide semiconductor layer as described in Embodiment 1 or 2 and the capacitor described in Embodiment 2.

Embodiment 8

In Embodiment 8, an example of a boosting circuit (a charge pump circuit) which can be formed using the transistor described in Embodiment 1 or 2 will be described.

Figure 17:
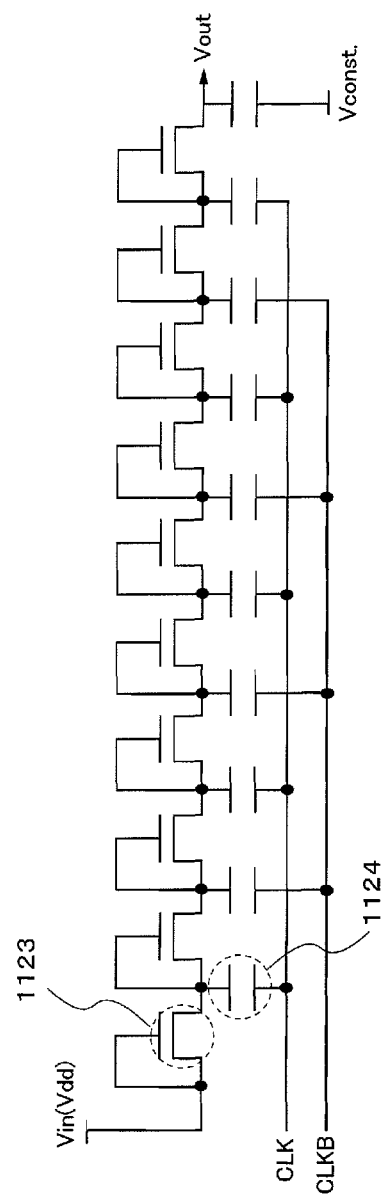
FIG. 17 is an equivalent circuit diagram illustrating one embodiment of the present invention.

FIG. 17 illustrates a specific structural example of a boosting circuit. The boosting circuit illustrated in FIG. 17 includes two clock signal lines, a plurality of transistors 1123 that are diode-connected in a forward direction, a plurality of capacitors 1124 whose one electrodes are connected between sources and drains of the plurality of transistors, and a storage capacitor whose one electrode is connected to the last of the plurality of transistors and the other electrode is kept at a constant potential. Each of the other electrodes of the plurality of capacitors is electrically connected to either of the two clock signal lines.

Note that a clock signal line may be further provided.

A transistor and a capacitor may be further provided in accordance with the potential to be output.

In the two clock signal lines, each clock signal is input as follows: when one clock signal line is switched to high level ($V_H$), the other is switched to low level ($V_L$).

Each of the clock signal CLK and the clock signal CLKB can be generated using a NOT circuit (inverter circuit) for example. The NOT circuit can be manufactured using the EDMOS circuit described in Embodiment 2.

By using the boosting circuit illustrated in FIG. 17, the potential input from Vin can be raised to Vout. For example, when a power supply potential Vdd is input from Vin, a potential higher than Vdd can be output from Vout and raised to a predetermined potential. Thus, a signal with the potential raised to a predetermined potential is input to a power supply line for example, and is used for each circuit mounted on the same substrate as the boosting circuit.

Note that here, the constant potential kept at the other electrode of the storage capacitor may be a power supply potential Vdd or a reference potential Vss for example.

In this specification, as a signal, an analog signal or a digital signal which uses voltage, current, resistance, frequency, or the like can be used, for example. For example, at least two potentials, that is, a first potential and a second potential are set, a high-level (also referred to as high potential or $V_H$) potential is used as the first potential, and a low-level (also referred to as low potential or $V_L$) potential is used as the second potential, whereby a binary digital signal can be set. Although $V_H$ and $V_L$ are preferably constant values, $V_H$ and $V_L$ each may take a range of values, in consideration of influence of noise.

In this specification, terms with ordinal numbers, such as "first" and "second", are used in order to avoid confusion among components, and the terms do not limit the components numerically.

The boosting circuit described above can be manufactured using the transistor described in Embodiment 1 and the capacitor described in Embodiment 2.

Embodiment 9

In Embodiment 9, examples of an electronic device mounted with the semiconductor integrated circuit which can be obtained in any of Embodiments 1 to 8 will be described with reference to FIGS. 18A to 18E. The semiconductor integrated circuit is mounted on a circuit board or the like and then incorporated inside the main body of each electronic device.

On a mother board, a semiconductor integrated circuit including the transistor in Embodiment 1 or 2 is mounted. The semiconductor integrated circuit is manufactured by mounting a logic circuit, a flash memory circuit, an SRAM circuit, the DRAM circuit described in Embodiment 6, or the like. Further, the CPU described in Embodiment 3 or a logic circuit can be mounted as well. The semiconductor integrated circuit can be mounted by a wire bonding method. In that case also, integrated circuit films having various shapes can be mounted.

Further, an FPC is attached to the circuit board, through which display devices or the like is connected thereto. A driver and a controller of a display portion can be formed. The driver of the display portion includes the shift register described in Embodiment 7 or the EDMOS circuit described in Embodiment 2.

Figure 18A:
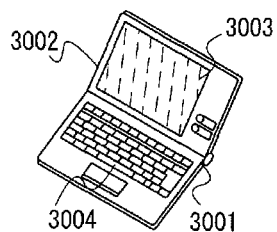
FIGS. 18A to 18E are views illustrating examples of an electronic device.

FIG. 18A illustrates a laptop personal computer manufactured by mounting at least the semiconductor integrated circuit as a component, which includes a main body 3001, a housing 3002, a display portion 3003, a keyboard 3004, and the like. The laptop personal computer includes the CPU described in Embodiment 3, the DRAM circuit described in Embodiment 6, or the like.

Figure 18D:
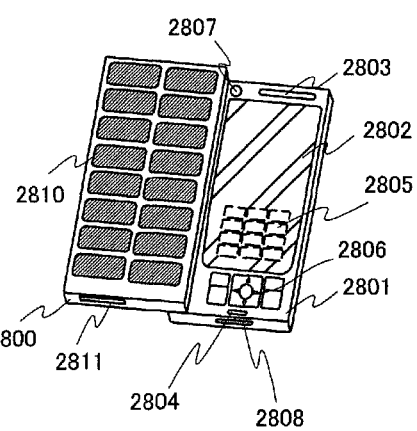
Figure 18B:
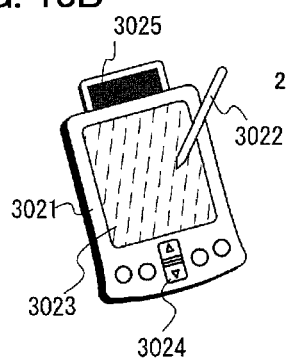

FIG. 18B illustrates a portable information terminal (PDA) manufactured by mounting at least the semiconductor integrated circuit as a component, which includes a display portion 3023, an external interface 3025, an operation button 3024, and the like in a main body 3021. A stylus 3022 is provided as an accessory for operation.

Figure 18C:
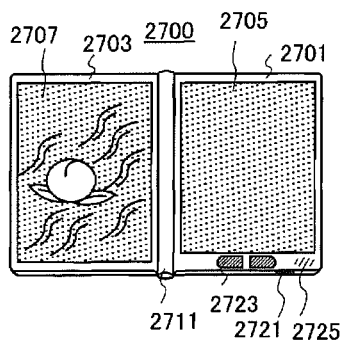

FIG. 18C illustrates an electronic paper manufactured by mounting at least the semiconductor integrated circuit as a component. An electronic paper can be used for electronic devices of a variety of fields as long as they can display data. For example, the electronic paper can be applied to an e-book reader (electronic book), a poster, an advertisement in a vehicle such as a train, or displays of various cards such as a credit card. FIG. 18C illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 18C) can display text and a display portion on the left (the display portion 2707 in FIG. 18C) can display graphics.

In the example illustrated in FIG. 18C, the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, book data or the like can be purchased and downloaded from an electronic book server.

FIG. 18D illustrates a mobile phone manufactured by mounting at least the semiconductor integrated circuit as a component, which includes two housings: a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar battery cell 2810 for charging of the portable information terminal, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 18D. The display panel 2802 is mounted with a booster circuit (the booster circuit described in Embodiment 8) for raising a voltage output from the solar battery cell 2810 to a voltage needed for each circuit.

Further, in addition to the above structure, the contactless IC chip, the small memory device, or the like described in Embodiment 4 or 5 may be incorporated.

In the display panel 2802, the display direction is appropriately changed depending on a usage pattern. Further, the display device is provided with the camera lens 2807 on the same surface as the display panel 2802, which enables usage as a video phone. The speaker 2803 and the microphone 2804 can be used for videophone calls, recording and playing sound, and the like as well as voice calls. Further, the housings 2800 and 2801 in a state where they are developed as illustrated in FIG. 18D can shift by sliding so that one is lapped over the other; therefore, the size of the mobile phone can be reduced, which makes the mobile phone suitable for being carried.

The external connection terminal 2808 can be connected to an AC adapter and various cables such as a USB cable, and charging and data communication with a personal computer or the like can be performed. Further, a large amount of data can be stored and moved by inserting a storage medium into the external memory slot 2811.

Further, in addition to the above functions, an infrared communication function, a television reception function, or the like may be provided.

Figure 18E:
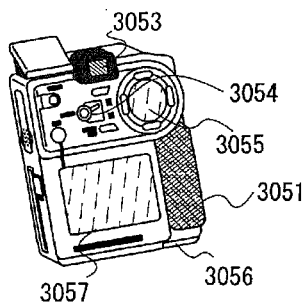

FIG. 18E illustrates a digital camera manufactured by mounting at least the semiconductor integrated circuit as a component, which includes a main body 3051, a display portion (A) 3057, an eyepiece 3053, operation switches 3054, a display portion (B) 3055, a battery 3056, and the like.

Embodiment 9 can be combined with any one of Embodiments 1 to 8 as appropriate.

Embodiment 10

In Embodiment 10, an example of a cross-sectional structure of a semiconductor integrated circuit will be described.

Figure 19:
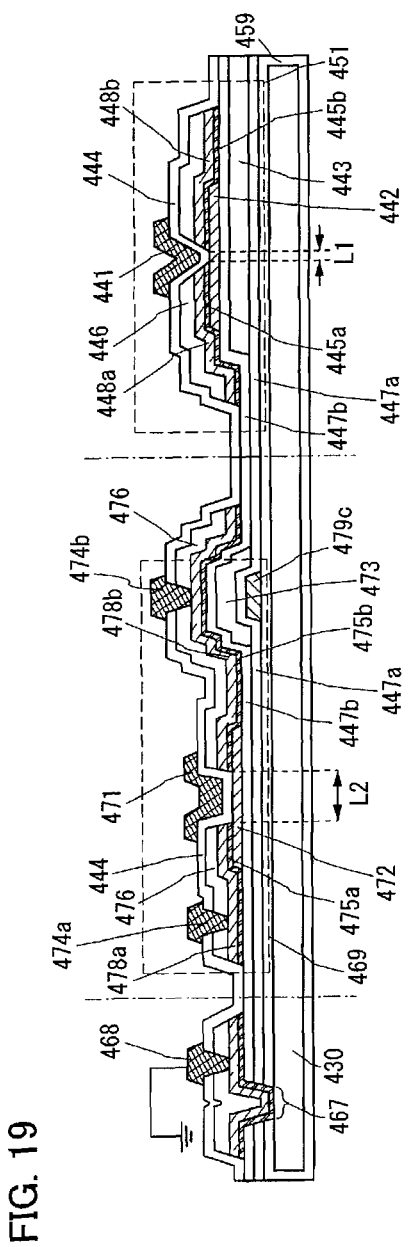
FIG. 19 is a cross-sectional view illustrating one embodiment of the present invention.

One mode of a semiconductor integrated circuit of this embodiment is described using FIG. 19. The manufacturing process (such as applicable materials) described in this embodiment is in common with that of Embodiment 1 in many points. Therefore, in the following description, details of parts which are common to those in Embodiment 1 are omitted, and different parts are described in detail.

A transistor 451 includes over a semiconductor substrate 430, a thermally-oxidized film 459, a first insulating layer 447a, a second insulating layer 443, a third insulating layer 447b, an oxide semiconductor layer 442, a first source electrode layer 445a, a second source electrode layer 448a, a first drain electrode layer 445b, a second drain electrode layer 448b, a gate insulating layer 444, and a gate electrode layer 441.

A transistor 469 includes over the semiconductor substrate 430, the thermally-oxidized film 459, an electrode layer 479c, the first insulating layer 447a, a fifth insulating layer 473, the third insulating layer 447b, an oxide semiconductor layer 472, a third source electrode layer 475a, a fourth source electrode layer 478a, a third drain electrode layer 475b, a fourth drain electrode layer 478b, the gate insulating layer 444, and a gate electrode layer 471.

First, an insulating film is formed over the semiconductor substrate 430. The transistors 451 and 469 are different from the transistors 440 and 470 described in Embodiment 1, in that the thermally-oxidized film 459 is provided as the insulating film over the semiconductor substrate. The method for forming the thermally-oxidized film over the semiconductor substrate is described below.

Thermal oxidation is performed on the semiconductor substrate 430, so that the thermally-oxidized film 459 (an SiOx film in this embodiment) is formed. Thermal oxidation enables formation of a dense and high-quality film, and therefore, it is preferable to use the thermally-oxidized film. The thermal oxidation is preferably performed in an oxygen atmosphere to which a halogen is added.

For example, the semiconductor substrate 430 is subjected to thermal oxidation in an oxygen atmosphere to which hydrogen chloride is added, so that the thermally-oxidized film 459 is formed. In that case, the thermally-oxidized film 459 is a film containing a chlorine atom.

The chlorine atom which is contained in the thermally-oxidized film 459 forms a distortion. As a result, absorption of moisture into the thermally-oxidized film 459 is improved and diffusion rate is increased. That is, when moisture exists in the surface of the thermally-oxidized film 459, moisture in the surface can be rapidly absorbed and diffused into the thermally-oxidized film 459. Further, defects due to oxide precipitated in a single crystal semiconductor film can be eliminated. Furthermore, a chloride of a heavy metal (such as Fe, Cr, Ni, or Mo) which is an extrinsic impurity can be formed to perform chemical gettering with outward diffusion so that the heavy metal is removed from the semiconductor substrate 430.

For example, the thermal oxidation can be performed at a temperature of 750° C. to 1150° C., preferably 900° C. to 1100° C. (typically, 1000° C.) in an oxygen atmosphere containing hydrogen chloride (HCl) at 0.5 vol % to 10 vol % (preferably 2 vol %) with respect to oxygen. The process time is 0.1 to 6 hours, preferably 0.5 to 1 hours. The oxidized film is formed to have a thickness of 10 nm to 1000 nm (preferably 50 nm to 300 nm), for example, 100 nm. By forming the thermally-oxidized film 459 in the oxygen atmosphere containing hydrogen chloride, the interface state density between the semiconductor substrate 430 and the thermally-oxidized film 459 can be reduced.

In this embodiment, the concentration of chlorine in the thermally-oxidized film 459 is controlled to $1 \times 10^{17}$ atoms/$cm^3$ to $1 \times 10^{21}$ atoms/$cm^3$.

Further, halogen atoms to be contained in the thermally-oxidized film 459 are not limited to chlorine atoms. A fluorine atom may be contained in the thermally-oxidized film 459. In order to perform fluorine oxidation on the surface of the semiconductor substrate 430, the following may be performed: the surface of the semiconductor substrate 430 is soaked in HF solution and then thermal oxidation is performed thereon in an oxygen atmosphere; or thermal oxidation is performed on the semiconductor substrate 430 in an oxygen atmosphere to which $NF_3$ is added.

Furthermore, it is preferable that after the thermal oxidation is performed in an oxygen atmosphere containing hydrogen chloride, heat treatment be performed in a nitrogen atmosphere. Accordingly, defects can be reduced.

Further, if the thermally-oxidized film provided for the rear surface (the surface which is not provided for the transistors) of the semiconductor substrate 430 is not necessary, the thermally-oxidized film provided for that region may be removed by etching or grinding.

Next, after the conductive film is formed over the thermally-oxidized film 459, the electrode layer 479c is formed by a first photolithography step.

The transistor 469 is different from the transistor 470, in that the electrode layer 479c shown in FIG. 1 is not provided.

In a semiconductor device according to one embodiment of the present invention, a transistor is formed over a semiconductor substrate. The semiconductor substrate can be functioned as a back gate, and therefore, a semiconductor device with high reliability can be manufactured without providing an electrode layer which is functioned as a back gate, according to one embodiment of the present invention.

Next, the first insulating layer 447a is formed to cover the electrode layer 479c.

Next, a spacer insulating layer is formed over the first insulating layer 447a, and is selectively removed then by a second photolithography step, so that the second insulating layer 443 is formed. By the same step, the fifth insulating layer 473 functioning as a spacer insulating layer is formed so as to overlap with the electrode layer 479c.

Next, the third insulating layer 447b is formed to cover the electrode layer 479c.

Next, an oxide semiconductor film is formed to a thickness of greater than or equal to 2 nm and less than or equal to 200 nm over the third insulating layer 447b, and is processed into the island-shaped oxide semiconductor layers 442 and 472 by a third photolithography step. In this embodiment, a first heat treatment is performed on the island-shaped oxide semiconductor layers 442 and 472.

Next, a resist mask is formed over the third insulating layer 447b by a fourth photolithography step, and selective etching is performed so as to form an opening 467 which reaches the semiconductor substrate 430.

Next, a conductive film is formed over the third insulating layer 447b and the oxide semiconductor layers 442 and 472.

Next, an insulating film with a thickness of greater than or equal to 200 nm and less than or equal to 2000 nm is formed over the conductive film by a plasma CVD method, a sputtering method, or the like, using a single layer or stacked layers of a silicon oxide layer, a silicon nitride layer, a silicon oxynitride layer, and/or a silicon nitride oxide layer.

Next, a resist mask is formed over the insulating film by a fifth photolithography step, and selective etching is performed, so that the fourth insulating layer 446, the fifth insulating layer 476, the first source electrode layer 445a, the second source electrode layer 448a, the first drain electrode layer 445b, and the second drain electrode layer 448b are formed. After that, the resist mask is removed.

Next, the gate insulating layer 444 is formed over the third insulating layer 447b, a fourth insulating layer 446, a fifth insulating layer 476, the oxide semiconductor layers 442 and 472, the first source electrode layer 445a, the second source electrode layer 448a, the first drain electrode layer 445b, and the second drain electrode layer 448b.

Next, a resist mask is formed by a sixth photolithography step, selective etching is performed so as to remove part of the gate insulating layer 444 and the fifth insulating layer 476, so that an opening is formed to reach the source electrode layer or the drain electrode layer of the transistor 469.

Next, a conductive film is formed over the gate insulating layer 444 and the opening, and a seventh photolithography step is performed, so that gate electrode layers 441 and 471 and wiring layers 468, 474a, and 474b are formed. The wiring layer 468 is a power supply line of a ground potential (a ground power supply line) and is electrically connected to the semiconductor substrate 430. Although the structure in which electrical conduction is performed from the rear surface (the surface which is not provided with the transistors) of the semiconductor substrate 430 is described in Embodiment 1, the structure in which electrical conduction is performed from the top surface (the surface which is provided with the transistors) of the semiconductor substrate 430 is described in Embodiment 10. In this manner, a semiconductor device according to one embodiment of the present invention may have either of the structure in which electrical conduction is performed from the top surface of the semiconductor substrate 430 and the structure in which electrical conduction is performed from the rear surface of the semiconductor substrate 430.

Next, in this embodiment, a second heat treatment is performed at 250° C. in a nitrogen atmosphere for one hour.

Through the above steps, the transistors 451 and 469 respectively including the oxide semiconductor layers 442 and 472 with reduced concentration of hydrogen, moisture, hydride, and hydroxide can be formed.

In this manner, a transistor which is formed over a semiconductor substrate and includes an oxide semiconductor layer with sufficiently reduced hydrogen concentration is used, whereby generation of a parasitic channel can be suppressed, the leakage current can be extremely decreased, and parasitic capacitance can be decreased. Further, since the transistor in accordance with this embodiment is provided over the semiconductor substrate, the transistor can be shielded from static electricity as compared to the case of using an insulating substrate. By shielding the transistor from static electricity, the number of carriers due to static electricity can be reduced. This transistor is used in the semiconductor integrated circuit described in Embodiment 10, so that a semiconductor device power consumption thereof is small can be attained.

This application is based on Japanese Patent Application serial no. 2009-249815 filed with Japan Patent Office on Oct. 30, 2009, the entire contents of which are hereby incorporated by reference.

The invention claimed is:

1. A semiconductor device comprising:
a semiconductor substrate;
a first gate electrode layer over the semiconductor substrate;
a first electrode layer over the semiconductor substrate;
a first gate insulating layer over the first gate electrode layer and the first electrode layer;
an oxide semiconductor layer over the first gate insulating layer;
a first insulating layer over the first electrode layer;
a source electrode layer and a drain electrode layer over the oxide semiconductor layer;
a second gate insulating layer over the oxide semiconductor layer, the source electrode layer, and the drain electrode layer; and
a second gate electrode layer over the second gate insulating layer,
wherein at least part of the drain electrode layer overlaps with the first electrode layer, and
wherein the first insulating layer and the first gate insulating layer are provided between the drain electrode layer and the first electrode layer.

2. The semiconductor device according to claim 1, wherein the semiconductor device is a CPU.

3. The semiconductor device according to claim 1, wherein the semiconductor device is an LSI.

4. The semiconductor device according to claim 1, wherein the semiconductor device is a DRAM.

5. The semiconductor device according to claim 1,
wherein a hydrogen concentration in the oxide semiconductor layer is lower than or equal to $5 \times 10^{19}$ atoms/cm$^3$, and
wherein a carrier concentration in the oxide semiconductor layer is lower than or equal to $5 \times 10^{14}$/cm$^3$.

6. The semiconductor device according to claim 1, wherein the semiconductor device is an EDMOS circuit.

7. The semiconductor device according to claim 1, wherein the semiconductor substrate electrode is set to a fixed potential or a ground potential.

8. A semiconductor device comprising an EDMOS circuit comprising:
a semiconductor substrate;
a first thin film transistor over the semiconductor substrate; and
a second thin film transistor over the semiconductor substrate,
wherein the first thin film transistor comprises:
a first gate electrode layer;
a first gate insulating layer over the first gate electrode layer;
an first oxide semiconductor layer over the first gate insulating layer;
a first source electrode layer and a first drain electrode layer over the first oxide semiconductor layer;
a second gate insulating layer over the first oxide semiconductor layer, the first source electrode layer, and the first drain electrode layer; and
a second gate electrode layer over the second gate insulating layer,
wherein the second thin film transistor comprises:
a first insulating layer;
a second oxide semiconductor layer over the first insulating layer;
a second source electrode layer and a second drain electrode layer over the second oxide semiconductor layer;
a third gate insulating layer over the second oxide semiconductor layer, the second source electrode layer, and the second drain electrode layer; and
a third gate electrode layer over the third gate insulating layer,
wherein the first drain electrode layer is electrically connected to the second source electrode layer, and
wherein the third gate electrode layer is electrically connected to the second source electrode layer.

9. The semiconductor device according to claim 8, wherein an off-current value in each of the first thin film transistor and the second thin film transistor is less than or equal to $1 \times 10^{-13}$ A.

10. The semiconductor device according to claim 8,
wherein a hydrogen concentration in each of the first oxide semiconductor layer and the second oxide semiconductor layer is lower than or equal to $5 \times 10^{19}$ atoms/cm$^3$, and
wherein a carrier concentration in each of the first oxide semiconductor layer and the second oxide semiconductor layer is lower than or equal to $5 \times 10^{14}$/cm$^3$.

11. The semiconductor device according to claim 8,
wherein a channel length of the first thin film transistor is longer than a channel length of the second thin film transistor.

12. The semiconductor device according to claim 8,
wherein a thickness of the first oxide semiconductor layer is smaller than a thickness of the second oxide semiconductor layer.

13. The semiconductor device according to claim 8, wherein the semiconductor device is a CPU.

14. The semiconductor device according to claim 8, wherein the semiconductor device is an LSI.

15. The semiconductor device according to claim 8, wherein the semiconductor device is a DRAM.

16. The semiconductor device according to claim 8, wherein the semiconductor substrate is set to a fixed potential or a ground potential.

* * * * *

UNITED STATES PATENT AND TRADEMARK OFFICE
CERTIFICATE OF CORRECTION

PATENT NO. : 8,421,069 B2  
APPLICATION NO. : 12/904579  
DATED : April 16, 2013  
INVENTOR(S) : Shunpei Yamazaki et al.

Page 1 of 1

It is certified that error appears in the above-identified patent and that said Letters Patent is hereby corrected as shown below:

In the Specification

Column 27, line 9, replace "($V_D$ > 0)" with --($V_D$ > 0)--;

Column 27, line 11, replace "($V_G$ = =0)" with --($V_G$ = 0)--;

Column 27, line 12, replace "($V_G$ >    0)" with --($V_G$ > 0)--;

Column 27, line 14, replace "($V_G$ >    0)" with --($V_G$ > 0)--;

Column 27, line 19, replace "($V_G$ >    0)" with --($V_G$ > 0)--.

Signed and Sealed this  
Eleventh Day of March, 2014

Michelle K. Lee  
*Deputy Director of the United States Patent and Trademark Office*